(12) United States Patent
Terao et al.

(10) Patent No.: US 11,646,243 B2
(45) Date of Patent: May 9, 2023

(54) HEAT SINK AND METHOD FOR MANUFACTURING SAME

(71) Applicant: JFE PRECISION CORPORATION, Niigata (JP)

(72) Inventors: Hoshiaki Terao, Niigata (JP); Kouichi Hashimoto, Niigata (JP)

(73) Assignee: JFE PRECISION CORPORATION, Niigata (JP)

( * ) Notice: Subject to any disclaimer, the term of this patent is extended or adjusted under 35 U.S.C. 154(b) by 308 days.

(21) Appl. No.: 16/763,983

(22) PCT Filed: Nov. 16, 2018

(86) PCT No.: PCT/JP2018/042574
§ 371 (c)(1),
(2) Date: May 14, 2020

(87) PCT Pub. No.: WO2019/098350
PCT Pub. Date: May 23, 2019

(65) Prior Publication Data
US 2020/0395268 A1    Dec. 17, 2020

(30) Foreign Application Priority Data

Nov. 18, 2017  (JP) .............................. JP2017-222337

(51) Int. Cl.
*H01L 23/373* (2006.01)
*B32B 15/01* (2006.01)
*H01L 21/48* (2006.01)

(52) U.S. Cl.
CPC .......... *H01L 23/3735* (2013.01); *B32B 15/01* (2013.01); *H01L 21/4882* (2013.01); *Y10T 428/1291* (2015.01)

(58) Field of Classification Search
CPC ................ H01L 23/3735; B32B 15/01; Y10T 428/1291
See application file for complete search history.

(56) References Cited

U.S. PATENT DOCUMENTS

| 5,356,661 A | 10/1994 | Doi et al. |
| 6,129,993 A | 10/2000 | Kumamoto et al. |
| (Continued) | | |

FOREIGN PATENT DOCUMENTS

| CN | 102371719 A | 3/2012 |
| CN | 102612745 A | 7/2012 |
| (Continued) | | |

OTHER PUBLICATIONS

Dec. 9, 2020, the Extended European Search Report issued by the European Patent Office in the corresponding European Patent Application No. 18877774.2.

(Continued)

*Primary Examiner* — Adam Krupicka
(74) *Attorney, Agent, or Firm* — Kenja IP Law PC

(57) ABSTRACT

Provided is a heat sink that has a clad structure of a Cu—Mo composite material and a Cu material and has a low coefficient of thermal expansion and high thermal conductivity. A heat sink comprises three or more Cu layers and two or more Cu—Mo composite layers alternately stacked in a thickness direction so that two of the Cu layers are outermost layers on both sides, wherein each of the Cu—Mo composite layers has a thickness section microstructure in which flat Mo phase is dispersed in a Cu matrix. The heat sink has a low coefficient of thermal expansion and also has high thermal conductivity in the thickness direction because the thickness of each of the Cu layers which are the outermost layers is reduced, as compared with a heat sink of a three-layer clad structure having the same thickness and density.

19 Claims, 8 Drawing Sheets

(56) References Cited

U.S. PATENT DOCUMENTS

| | | |
|---|---|---|
| 9,299,636 B2 | 3/2016 | Terao et al. |
| 10,215,512 B2 | 2/2019 | Oki et al. |
| 2002/0191377 A1 | 12/2002 | Osada et al. |
| 2012/0186800 A1 | 7/2012 | Terao et al. |
| 2017/0198991 A1 | 7/2017 | Oki et al. |
| 2017/0317009 A1 | 11/2017 | Fukui |

FOREIGN PATENT DOCUMENTS

| | | |
|---|---|---|
| CN | 102941702 A | 2/2013 |
| CN | 106460191 A | 2/2017 |
| EP | 0432867 A2 | 6/1991 |
| EP | 1202345 A2 | 5/2002 |
| EP | 1553627 A1 | 7/2005 |
| EP | 2485257 A1 | 8/2012 |
| EP | 3147384 A1 | 3/2017 |
| JP | H11297908 A | 10/1999 |
| JP | H11307701 A | 11/1999 |
| JP | 2000133756 A | 5/2000 |
| JP | 2000183236 A | 6/2000 |
| JP | 2001358266 A | 12/2001 |
| JP | 2006100640 A | 4/2006 |
| JP | 2007142126 A | 6/2007 |
| JP | 2008057032 A | 3/2008 |
| JP | 2010219441 A | 9/2010 |
| JP | 2011119600 A | 6/2011 |
| JP | 2011129880 A | 6/2011 |
| JP | 2016111328 A | 6/2016 |
| JP | 2017028295 A | 2/2017 |
| WO | 0180313 A1 | 10/2001 |
| WO | 2016088687 A1 | 6/2016 |

OTHER PUBLICATIONS

Jun. 3, 2021, Office Action issued by the Korean Intellectual Property Office in the corresponding Korean Patent Application No. 10-2020-7017096 with English language concise statement of relevance.

Jan. 22, 2019, International Search Report issued in the International Patent Application No. PCT/JP2018/042574.

Jan. 12, 2023, Office Action issued by the China National Intellectual Property Administration in the corresponding Chinese Patent Application No. 201880074130.6 with English language search report.

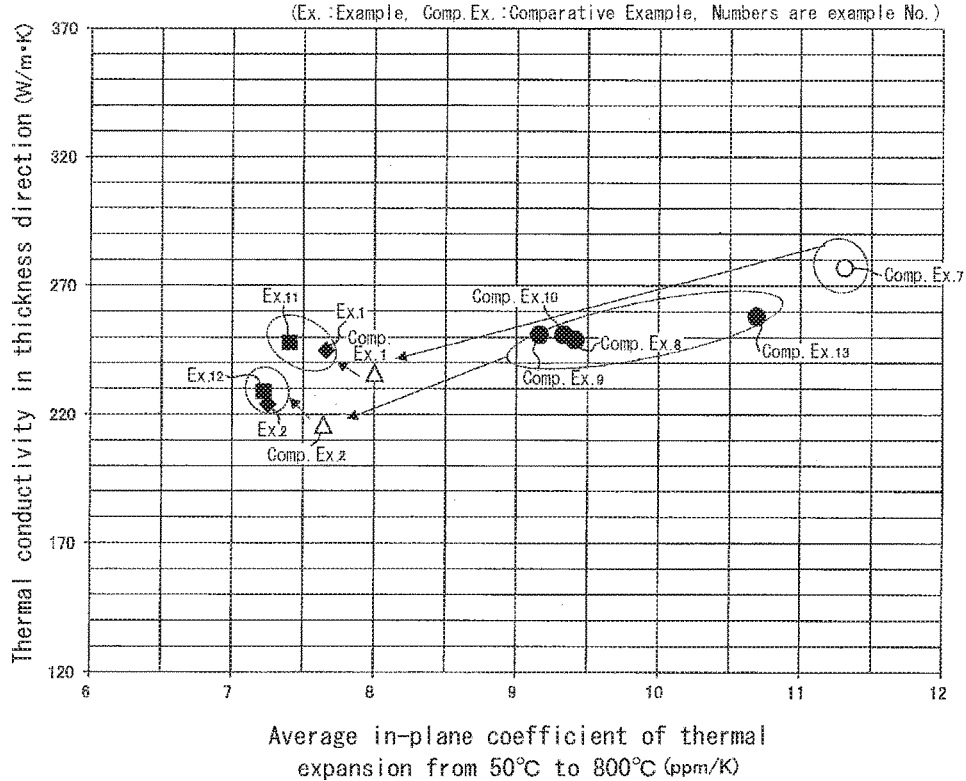

FIG. 2

◆ Five-layer clad material of Example 1, Cu-Mo composite layer, :25%Cu-Mo, density9.29, total cold rolling reduction 95%
  Five-layer clad material of Example 2, Cu-Mo composite layer, :25%Cu-Mo, density9.38, total cold rolling reduction 95%
■ Seven-layer clad material of Example 11, Cu-Mo composite layer, :25%Cu-Mo, density9.29, total cold rolling reduction 95%
  Seven-layer clad material of Example 12, Cu-Mo composite layer, :25%Cu-Mo, density9.38, total cold rolling reduction 95%
△ Three-layer clad material of Comparative Example 1(*1), Cu-Mo composite layer, :25%Cu-Mo, density9.30,
  total cold rolling reduction 95%
  Three-layer clad material of Comparative Example 2(*1), Cu-Mo composite layer, :25%Cu-Mo, density9.37,
  total cold rolling reduction 95%
○ Cu-Mo composite material alone of Comparative Example 7, 66%Cu-Mo, density9.32, total cold rolling reduction 93.5%
● Cu-Mo composite material alone of Comparative Example 8, 59%Cu-Mo, density9.41, total cold rolling reduction 93.5%
  Cu-Mo composite material alone of Comparative Example 9, 61%Cu-Mo, density9.39, total cold rolling reduction 93.5%
  Cu-Mo composite material alone of Comparative Example 10, 60%Cu-Mo, density9.40, total cold rolling reduction 93.5%
  Cu-Mo composite material alone of Comparative Example 13, 61%Cu-Mo, density9.39, total cold rolling reduction 93.5%
  (*1:Three-layer clad material having clad structure in PTL 2)

FIG. 3

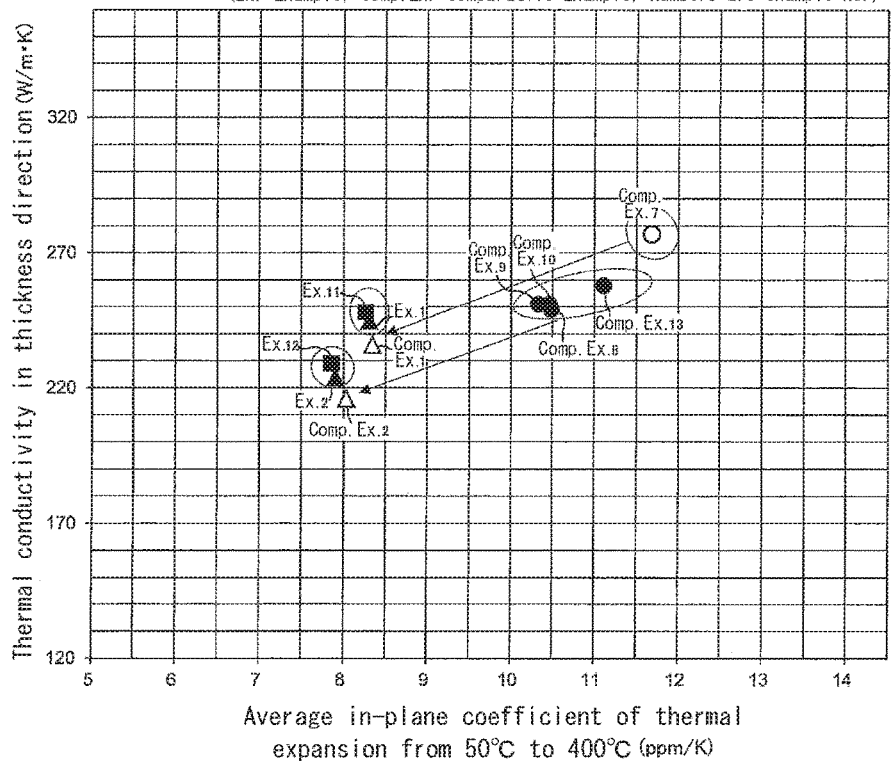

(Ex.: Example, Comp. Ex.: Comparative Example, Numbers are example No.)

- ◆ Five-layer clad material of Example 1, Cu-Mo composite layer, :25%Cu-Mo, density9.29, total cold rolling reduction 95%
  Five-layer clad material of Example 2, Cu-Mo composite layer, :25%Cu-Mo, density9.38, total cold rolling reduction 95%
- ■ Seven-layer clad material of Example 11, Cu-Mo composite layer, :25%Cu-Mo, density9.29, total cold rolling reduction 95%
  Seven-layer clad material of Example 12, Cu-Mo composite layer, :25%Cu-Mo, density9.38, total cold rolling reduction 95%
- △ Three-layer clad material of Comparative Example 1(∗1), Cu-Mo composite layer, :25%Cu-Mo, density9.30, total cold rolling reduction 95%
  Three-layer clad material of Comparative Example 2(∗1), Cu-Mo composite layer, :25%Cu-Mo, density9.37, total cold rolling reduction 95%
- ○ Cu-Mo composite material alone of Comparative Example 7, 66%Cu-Mo, density9.32, total cold rolling reduction 93.5%
- ● Cu-Mo composite material alone of Comparative Example 8, 59%Cu-Mo, density9.41, total cold rolling reduction 93.5%
  Cu-Mo composite material alone of Comparative Example 9, 61%Cu-Mo, density9.39, total cold rolling reduction 93.5%
  Cu-Mo composite material alone of Comparative Example 10, 60%Cu-Mo, density9.40, total cold rolling reduction 93.5%
  Cu-Mo composite material alone of Comparative Example 13, 61%Cu-Mo, density9.39, total cold rolling reduction 93.5%
  (∗1:Three-layer clad material having clad structure in PTL 2)

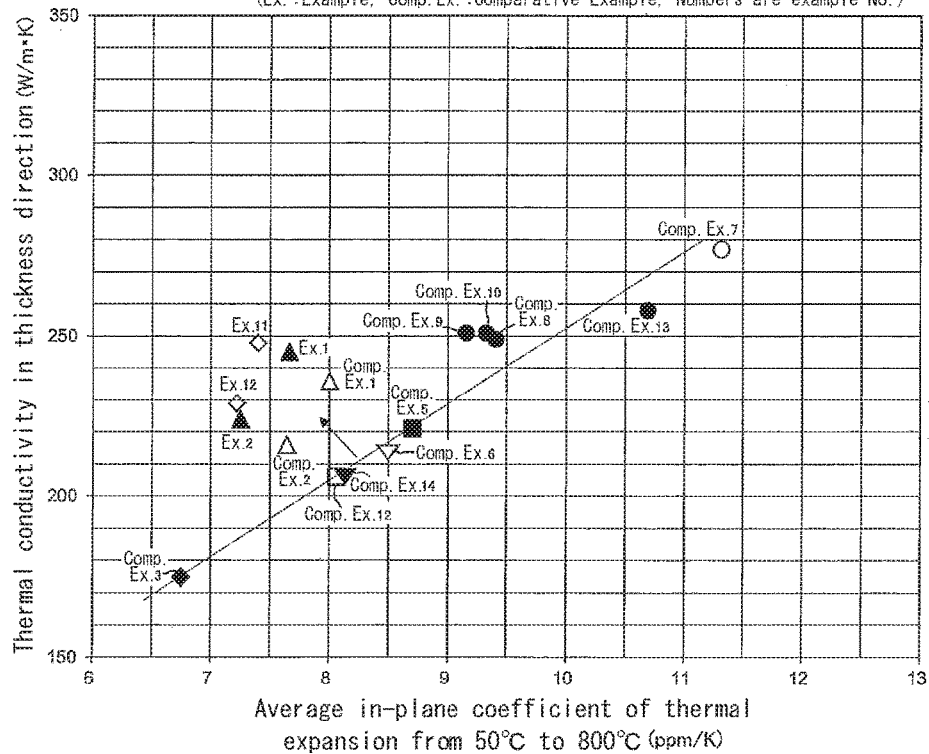

FIG. 4

(Ex.:Example, Comp.Ex.:Comparative Example, Numbers are example No.)

▲ Five-layer clad material of Example 1, Cu-Mo composite layer, :25%Cu-Mo, density9.29, total cold rolling reduction 95%
Five-layer clad material of Example 2, Cu-Mo composite layer, :25%Cu-Mo, density9.38, total cold rolling reduction 95%
◇ Seven-layer clad material of Example 11, Cu-Mo composite layer, :25%Cu-Mo, density9.29, total cold rolling reduction 95%
Seven-layer clad material of Example 12, Cu-Mo composite layer, :25%Cu-Mo, density9.38, total cold rolling reduction 95%
△ Three-layer clad material of Comparative Example 1(∗1), Cu-Mo composite layer, :25%Cu-Mo, density9.30,
total cold rolling reduction 95%
Three-layer clad material of Comparative Example 2(∗1), Cu-Mo composite layer, :25%Cu-Mo, density9.37,
total cold rolling reduction 95%
◆ Cu-Mo composite material alone of Comparative Example 3, 25%Cu-Mo, density9.83, total cold rolling reduction 95%
■ Cu-Mo composite material alone of Comparative Example 5, 44%Cu-Mo, density9.60, total cold rolling reduction 90%
▽ Cu-Mo composite material alone of Comparative Example 6, 44%Cu-Mo, density9.60, total cold rolling reduction 93.5%
○ Cu-Mo composite material alone of Comparative Example 7, 66%Cu-Mo, density9.32, total cold rolling reduction 93.5%
● Cu-Mo composite material alone of Comparative Example 8, 59%Cu-Mo, density9.41, total cold rolling reduction 93.5%
Cu-Mo composite material alone of Comparative Example 9, 61%Cu-Mo, density9.39, total cold rolling reduction 93.5%
Cu-Mo composite material alone of Comparative Example 10, 60%Cu-Mo, density9.40, total cold rolling reduction 93.5%
Cu-Mo composite material alone of Comparative Example 13, 61%Cu-Mo, density9.39, total cold rolling reduction 93.5%
□ Cu-Mo composite material alone of Comparative Example 12, 40%Cu-Mo, density9.65, total cold rolling reduction 93.5%
▼ Cu-Mo composite material alone of Comparative Example 14, 40%Cu-Mo, density9.65, total cold rolling reduction 90%
(∗1:Three-layer clad material having clad structure in PTL 2)

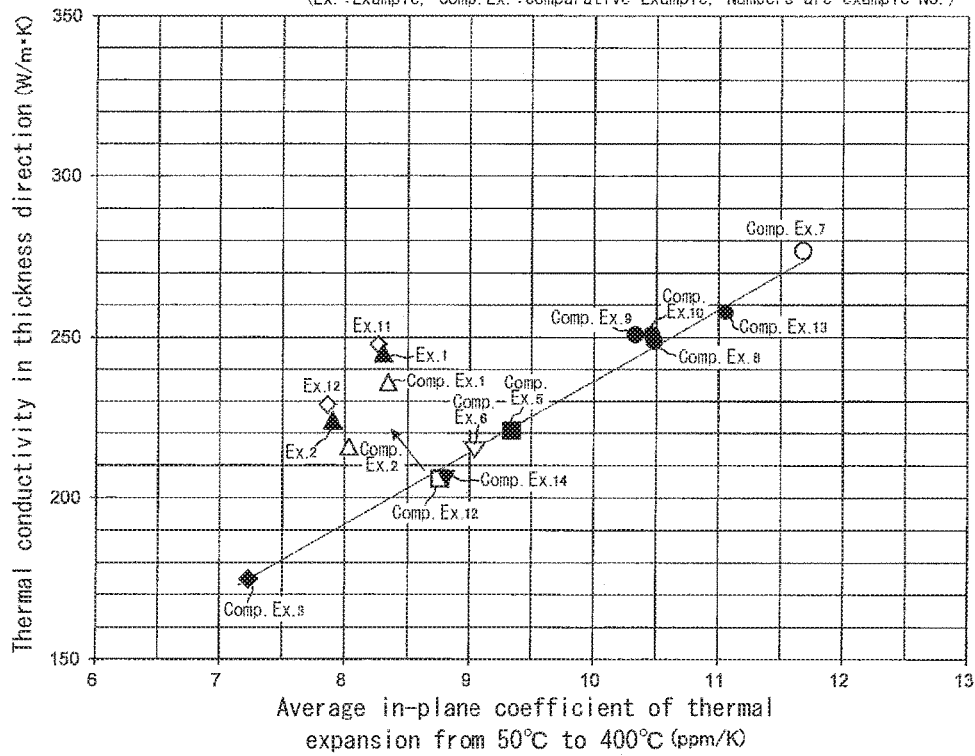

FIG. 5

(Ex.: Example, Comp.Ex.: Comparative Example, Numbers are example No.)

▲ Five-layer clad material of Example 1, Cu-Mo composite layer, :25%Cu-Mo, density 9.29, total cold rolling reduction 95%
　Five-layer clad material of Example 2, Cu-Mo composite layer, :25%Cu-Mo, density 9.38, total cold rolling reduction 95%
◇ Seven-layer clad material of Example 11, Cu-Mo composite layer, :25%Cu-Mo, density 9.29, total cold rolling reduction 95%
　Seven-layer clad material of Example 12, Cu-Mo composite layer, :25%Cu-Mo, density 9.38, total cold rolling reduction 95%
△ Three-layer clad material of Comparative Example 1(*1), Cu-Mo composite layer, :25%Cu-Mo, density 9.30,
　total cold rolling reduction 95%
　Three-layer clad material of Comparative Example 2(*1), Cu-Mo composite layer, :25%Cu-Mo, density 9.37,
　total cold rolling reduction 95%
◆ Cu-Mo composite material alone of Comparative Example 3, 25%Cu-Mo, density 9.83, total cold rolling reduction 95%
▓ Cu-Mo composite material alone of Comparative Example 5, 44%Cu-Mo, density 9.60, total cold rolling reduction 90%
▽ Cu-Mo composite material alone of Comparative Example 6, 44%Cu-Mo, density 9.60, total cold rolling reduction 93.5%
○ Cu-Mo composite material alone of Comparative Example 7, 66%Cu-Mo, density 9.32, total cold rolling reduction 93.5%
● Cu-Mo composite material alone of Comparative Example 8, 59%Cu-Mo, density 9.41, total cold rolling reduction 93.5%
　Cu-Mo composite material alone of Comparative Example 9, 61%Cu-Mo, density 9.39, total cold rolling reduction 93.5%
　Cu-Mo composite material alone of Comparative Example 10, 60%Cu-Mo, density 9.40, total cold rolling reduction 93.5%
　Cu-Mo composite material alone of Comparative Example 13, 61%Cu-Mo, density 9.39, total cold rolling reduction 93.5%
□ Cu-Mo composite material alone of Comparative Example 12, 40%Cu-Mo, density 9.65, total cold rolling reduction 93.5%
▼ Cu-Mo composite material alone of Comparative Example 14, 40%Cu-Mo, density 9.65, total cold rolling reduction 90%
　(*1:Three-layer clad material having clad structure in PTL 2)

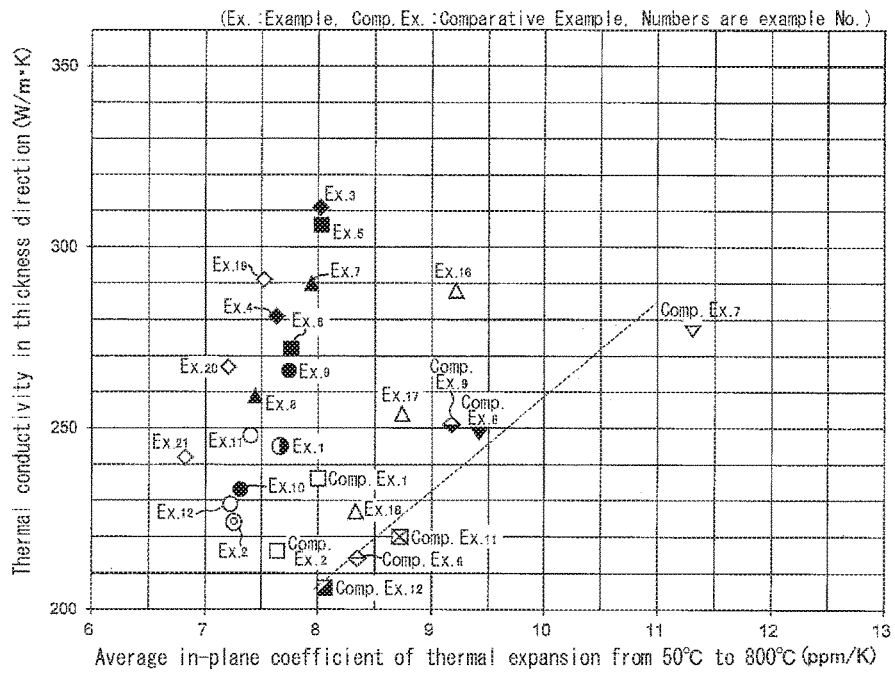

FIG. 6

● Five-layer clad material of Example 1, Cu-Mo composite layer, :25%Cu-Mo, density9.29, total cold rolling reduction 95%
◎ Five-layer clad material of Example 2, Cu-Mo composite layer, :25%Cu-Mo, density9.38, total cold rolling reduction 95%
◆ Five-layer clad material of Example 3, Cu-Mo composite layer, :25%Cu-Mo, density9.29, total cold rolling reduction 95%
  Five-layer clad material of Example 4, Cu-Mo composite layer, :25%Cu-Mo, density9.40, total cold rolling reduction 95%
■ Five-layer clad material of Example 5, Cu-Mo composite layer, :25%Cu-Mo, density9.30, total cold rolling reduction 95%
  Five-layer clad material of Example 6, Cu-Mo composite layer, :25%Cu-Mo, density9.40, total cold rolling reduction 95%
▲ Five-layer clad material of Example 7, Cu-Mo composite layer, :25%Cu-Mo, density9.29, total cold rolling reduction 95%
  Five-layer clad material of Example 8, Cu-Mo composite layer, :25%Cu-Mo, density9.39, total cold rolling reduction 95%
● Five-layer clad material of Example 9, Cu-Mo composite layer, :25%Cu-Mo, density9.30, total cold rolling reduction 95%
  Five-layer clad material of Example 10, Cu-Mo composite layer, :25%Cu-Mo, density9.39, total cold rolling reduction 95%
○ Seven-layer clad material of Example 11, Cu-Mo composite layer, :25%Cu-Mo, density9.29, total cold rolling reduction 95%
  Seven-layer clad material of Example 12, Cu-Mo composite layer, :25%Cu-Mo, density9.38, total cold rolling reduction 95%
△ Five-layer clad material of Example 16, Cu-Mo composite layer, :44%Cu-Mo, density9.31, total cold rolling reduction 95%
  Five-layer clad material of Example 17, Cu-Mo composite layer, :44%Cu-Mo, density9.41, total cold rolling reduction 95%
  Five-layer clad material of Example 18, Cu-Mo composite layer, :44%Cu-Mo, density9.51, total cold rolling reduction 95%
◇ Five-layer clad material of Example 19, Cu-Mo composite layer, :15%Cu-Mo, density9.36, total cold rolling reduction 95%
  Five-layer clad material of Example 20, Cu-Mo composite layer, :15%Cu-Mo, density9.43, total cold rolling reduction 95%
  Five-layer clad material of Example 21, Cu-Mo composite layer, :15%Cu-Mo, density9.52, total cold rolling reduction 95%
□ Three-layer clad material of Comparative Example 1(*1), Cu-Mo composite layer, :25%Cu-Mo, density9.30, total cold rolling reduction 95%
  Three-layer clad material of Comparative Example 2(*1), Cu-Mo composite layer, :25%Cu-Mo, density9.37, total cold rolling reduction 95%
◇ Cu-Mo composite material alone of Comparative Example 6, 44%Cu-Mo, density9.60, total cold rolling reduction 93.5%
▽ Cu-Mo composite material alone of Comparative Example 7, 66%Cu-Mo, density9.32, total cold rolling reduction 93.5%
▼ Cu-Mo composite material alone of Comparative Example 8, 59%Cu-Mo, density9.41, total cold rolling reduction 93.5%
◆ Cu-Mo composite material alone of Comparative Example 9, 61%Cu-Mo, density9.39, total cold rolling reduction 93.5%
⊠ Cu-Mo composite material alone of Comparative Example 11, 40%Cu-Mo, density9.41, total cold rolling reduction 93.5%
▨ Cu-Mo composite material alone of Comparative Example 12, 40%Cu-Mo, density9.65, total cold rolling reduction 93.5%
(*1:Three-layer clad material having clad structure in PTL 2)

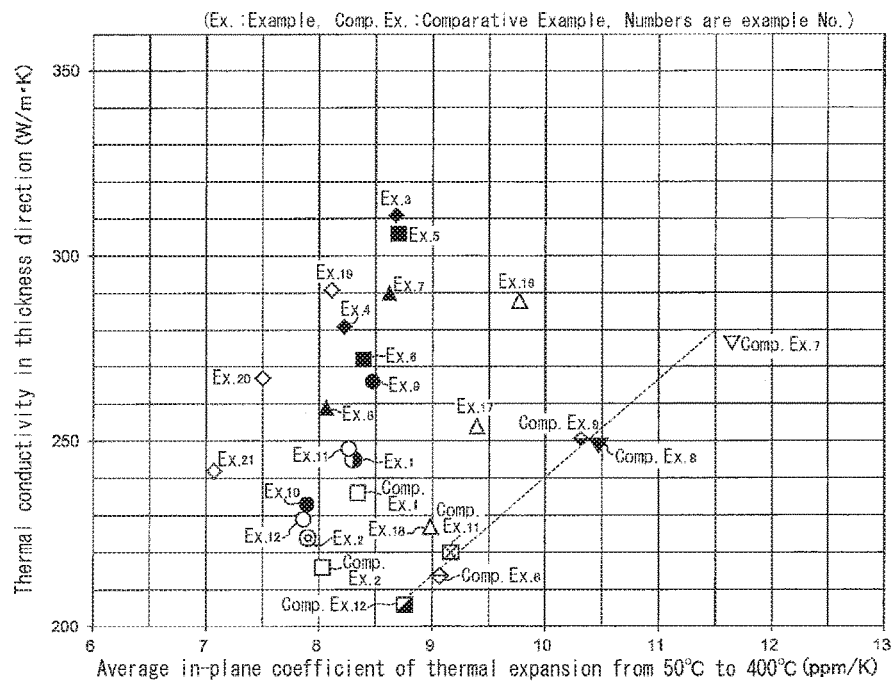

FIG. 7

(Ex.: Example, Comp. Ex.: Comparative Example, Numbers are example No.)

- ◐ Five-layer clad material of Example 1, Cu-Mo composite layer, :25%Cu-Mo, density9.29, total cold rolling reduction 95%
- ◉ Five-layer clad material of Example 2, Cu-Mo composite layer, :25%Cu-Mo, density9.38, total cold rolling reduction 95%
- ◆ Five-layer clad material of Example 3, Cu-Mo composite layer, :25%Cu-Mo, density9.29, total cold rolling reduction 95%
-   Five-layer clad material of Example 4, Cu-Mo composite layer, :25%Cu-Mo, density9.40, total cold rolling reduction 95%
- ▨ Five-layer clad material of Example 5, Cu-Mo composite layer, :25%Cu-Mo, density9.30, total cold rolling reduction 95%
-   Five-layer clad material of Example 6, Cu-Mo composite layer, :25%Cu-Mo, density9.40, total cold rolling reduction 95%
- ▲ Five-layer clad material of Example 7, Cu-Mo composite layer, :25%Cu-Mo, density9.29, total cold rolling reduction 95%
-   Five-layer clad material of Example 8, Cu-Mo composite layer, :25%Cu-Mo, density9.39, total cold rolling reduction 95%
- ● Five-layer clad material of Example 9, Cu-Mo composite layer, :25%Cu-Mo, density9.30, total cold rolling reduction 95%
-   Five-layer clad material of Example 10, Cu-Mo composite layer, :25%Cu-Mo, density9.39, total cold rolling reduction 95%
- ○ Seven-layer clad material of Example 11, Cu-Mo composite layer, :25%Cu-Mo, density9.29, total cold rolling reduction 95%
-   Seven-layer clad material of Example 12, Cu-Mo composite layer, :25%Cu-Mo, density9.38, total cold rolling reduction 95%
- △ Five-layer clad material of Example 16, Cu-Mo composite layer, :44%Cu-Mo, density9.31, total cold rolling reduction 95%
-   Five-layer clad material of Example 17, Cu-Mo composite layer, :44%Cu-Mo, density9.41, total cold rolling reduction 95%
-   Five-layer clad material of Example 18, Cu-Mo composite layer, :44%Cu-Mo, density9.51, total cold rolling reduction 95%
- ◇ Five-layer clad material of Example 19, Cu-Mo composite layer, :15%Cu-Mo, density9.36, total cold rolling reduction 95%
-   Five-layer clad material of Example 20, Cu-Mo composite layer, :15%Cu-Mo, density9.43, total cold rolling reduction 95%
-   Five-layer clad material of Example 21, Cu-Mo composite layer, :15%Cu-Mo, density9.52, total cold rolling reduction 95%
- □ Three-layer clad material of Comparative Example 1(*1), Cu-Mo composite layer, :25%Cu-Mo, density9.30, total cold rolling reduction 95%
-   Three-layer clad material of Comparative Example 2(*1), Cu-Mo composite layer, :25%Cu-Mo, density9.37, total cold rolling reduction 95%
- ◇ Cu-Mo composite material alone of Comparative Example 6, 44%Cu-Mo, density9.60, total cold rolling reduction 93.5%
- ▽ Cu-Mo composite material alone of Comparative Example 7, 66%Cu-Mo, density9.32, total cold rolling reduction 93.5%
- ▼ Cu-Mo composite material alone of Comparative Example 8, 59%Cu-Mo, density9.41, total cold rolling reduction 93.5%
- ◆ Cu-Mo composite material alone of Comparative Example 9, 61%Cu-Mo, density9.39, total cold rolling reduction 93.5%
- ⊠ Cu-Mo composite material alone of Comparative Example 11, 40%Cu-Mo, density9.41, total cold rolling reduction 93.5%
- ▨ Cu-Mo composite material alone of Comparative Example 12, 40%Cu-Mo, density9.65, total cold rolling reduction 93.5%

(*1: Three-layer clad material having clad structure in PTL 2)

FIG. 8

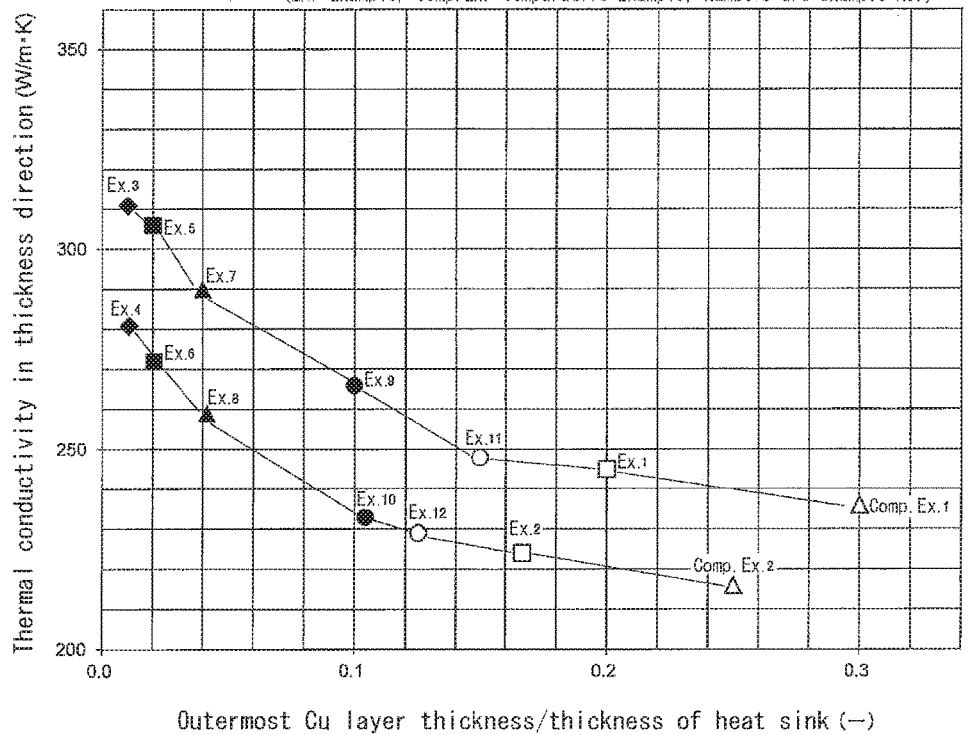

(Ex.:Example, Comp.Ex.:Comparative Example, Numbers are example No.)

Outermost Cu layer thickness/thickness of heat sink (—)

□ Five-layer clad material of Example 1, Cu-Mo composite layer,:25%Cu-Mo, density9.29, total cold rolling reduction 95%
   Five-layer clad material of Example 2, Cu-Mo composite layer,:25%Cu-Mo, density9.38, total cold rolling reduction 95%
◆ Five-layer clad material of Example 3, Cu-Mo composite layer,:25%Cu-Mo, density9.29, total cold rolling reduction 95%
   Five-layer clad material of Example 4, Cu-Mo composite layer,:25%Cu-Mo, density9.40, total cold rolling reduction 95%
▒ Five-layer clad material of Example 5, Cu-Mo composite layer,:25%Cu-Mo, density9.30, total cold rolling reduction 95%
   Five-layer clad material of Example 6, Cu-Mo composite layer,:25%Cu-Mo, density9.40, total cold rolling reduction 95%
▲ Five-layer clad material of Example 7, Cu-Mo composite layer,:25%Cu-Mo, density9.29, total cold rolling reduction 95%
   Five-layer clad material of Example 8, Cu-Mo composite layer,:25%Cu-Mo, density9.39, total cold rolling reduction 95%
● Five-layer clad material of Example 9, Cu-Mo composite layer,:25%Cu-Mo, density9.30, total cold rolling reduction 95%
   Five-layer clad material of Example 10, Cu-Mo composite layer,:25%Cu-Mo, density9.39, total cold rolling reduction 95%
○ Seven-layer clad material of Example 11, Cu-Mo composite layer,:25%Cu-Mo, density9.29, total cold rolling reduction 95%
   Seven-layer clad material of Example 12, Cu-Mo composite layer,:25%Cu-Mo, density9.38, total cold rolling reduction 95%
△ Three-layer clad material of Comparative Example 1(*1), Cu-Mo composite layer,:25%Cu-Mo, density9.30,
   total cold rolling reduction 95%
   Three-layer clad material of Comparative Example 2(*1), Cu-Mo composite layer,:25%Cu-Mo, density9.37,
   total cold rolling reduction 95%

(*1:Three-layer clad material having clad structure in PTL 2)

HEAT SINK AND METHOD FOR MANUFACTURING SAME

TECHNICAL FIELD

The present disclosure relates to a heat sink used to efficiently dissipate heat generated from a heat generator such as a semiconductor element, and a method for manufacturing the same.

BACKGROUND

A heat sink is used to efficiently dissipate heat generated from a semiconductor element, from the semiconductor device. The heat sink is required to have high thermal (heat) conductivity for its function. Moreover, since the heat sink is bonded to a semiconductor, a ceramic circuit substrate, a metal package member, or the like by soldering or brazing, the heat sink is required to have a coefficient of thermal (heat) expansion (low coefficient of thermal expansion) close to that of the member to which the heat sink is bonded.

A Mo—Cu composite material has been conventionally used as a heat sink having high thermal conductivity and a low coefficient of thermal expansion (for example, JP H11-307701 A (PTL 1)). Typically, a Mo—Cu composite material used in a heat sink is manufactured by pressing a Mo powder or a mixed powder of a Mo powder and a Cu powder to obtain a green compact, optionally reducing sintering the green compact, and then subjecting it to Cu infiltration or densification to obtain a Mo—Cu composite material and rolling the Mo—Cu composite material. Mo hardly dissolves with Cu, so that the Mo—Cu composite material has a dual phase structure of Mo and Cu. A heat sink taking advantage of the property of Mo having a low coefficient of thermal expansion and the property of Cu having high thermal conductivity can thus be yielded.

JP 2001-358266 A (PTL 2) discloses, as a heat sink based on such a Mo—Cu composite material, a heat sink obtained by pressure joining Cu sheets to both sides of a Mo—Cu composite material yielded through a specific rolling process. According to PTL 2, this heat sink has higher thermal conductivity than a [Cu/Mo/Cu] clad material and also has excellent press blanking workability.

A Mo—Cu composite material is qualitatively known to decrease in coefficient of thermal expansion as a result of rolling. Hence, the Mo—Cu composite material is manufactured through the rolling process as mentioned above. Based on the conventional understanding that Mo particles resist deformation by rolling as Mo particles are hard and small as primary particles, warm rolling at about 200° C. to 400° C. is performed as the rolling of the Mo—Cu composite material (PTL 1). PTL 2 discloses a manufacturing method whereby warm rolling is performed as primary rolling and cold rolling is performed as secondary rolling. In this manufacturing method, too, warm rolling (primary rolling) is an essential step on the assumption that Mo particles resist deformation.

Higher-output semiconductor devices in recent years have made the heat-sink property of heat sinks more important. Meanwhile, the need for more compact semiconductor modules is high, and heat sinks are required to dissipate heat from a smaller area. Thus, the heat-sink property in the thickness direction is more important than the heat-sink property in the plane (i.e. surface) direction.

CITATION LIST

Patent Literatures

PTL 1: JP H11-307701 A
PTL 2: JP 2001-358266 A

SUMMARY

Technical Problem

Our studies revealed that, although the heat sink described in PTL 2 has better thermal properties (low thermal expansion) than, for example, the Mo—Cu composite material alone described in PTL 1, as a clad structure in which a Mo—Cu composite material and a Cu material are stacked, there is an optimal clad structure having better thermal properties (in particular, thermal conductivity in the thickness direction) than the Cu/(Cu—Mo)/Cu structure described in PTL 2.

It could therefore be helpful to provide a heat sink that has a clad structure of a Mo—Cu composite material and a Cu material and has a low coefficient of thermal expansion and high thermal conductivity.

It could also be helpful to provide a method for manufacturing such a heat sink having excellent thermal properties stably at low cost.

Solution to Problem

For the clad material having the Cu/(Cu—Mo)/Cu structure described in PTL 2, we decided to study a clad material of five or more layers based on the idea that a plurality of layers of the Mo—Cu composite material and a plurality of layers of the Cu material are stacked to enhance the restraint of the Cu layers by the Mo—Cu composite layers and decrease the coefficient of thermal expansion, but did not particularly expected an improvement in thermal conductivity. However, contrary to the initial expectation, our studies revealed the following: By setting the number of layers of the Mo—Cu composite material and the Cu material stacked to five or more layers, i.e. by using a Cu/(Cu—Mo)/Cu/(Cu—Mo)/Cu structure (five-layer clad structure) or a Cu/(Cu—Mo)/Cu/(Cu—Mo)/Cu/(Cu—Mo)/Cu structure (seven-layer clad structure), not only the in-plane coefficient of thermal expansion is decreased but also the thermal conductivity in the thickness direction is significantly increased as compared with the Cu/(Cu—Mo)/Cu structure (three-layer clad structure) having the same thickness and density. Moreover, by setting the thickness of each of the Cu layers which are the outermost layers to be less than the thickness of each intermediate Cu layer, the thermal conductivity is improved particularly remarkably. Furthermore, when manufacturing such a clad material, the coefficient of thermal expansion is decreased more effectively by cold rolling the material at a high rolling reduction (total rolling reduction) or warm rolling the material at a temperature of about 250° C. or less with which the surface does not oxidize noticeably.

The present disclosure is based on these discoveries. We thus provide:

[1] A heat sink comprising three or more Cu layers and two or more Cu—Mo composite layers alternately stacked in a thickness direction so that two of the Cu layers are outermost layers on both sides, wherein each of the Cu—Mo composite layers has a thickness section microstructure in which flat Mo phase is dispersed in a Cu matrix.

[2] The heat sink according to [1], wherein a thickness $t_1$ of each of the Cu layers (1a) which are the outermost layers on both sides and a thickness $t_2$ of a Cu layer (1b) which is an intermediate layer satisfy $t_1 \leq t_2$.

[3] The heat sink according to [2], wherein the thickness $t_1$ of each of the Cu layers (1a) which are the outermost layers on both sides and a thickness T of the heat sink satisfy $t_1/T \leq 0.2$.

[4] The heat sink according to [2] or [3], wherein the thickness $t_1$ of each of the Cu layers (1a) which are the outermost layers on both sides and the thickness $t_2$ of the Cu layer (1b) which is the intermediate layer satisfy $t_1 < t_2$.

[5] The heat sink according to [4], wherein a total number of the Cu layers and the Cu—Mo composite layers is nine or more, and, among a plurality of Cu layers (1b) which are intermediate layers, a Cu layer (1b) closer to a thickness center of the heat sink has a greater thickness $t_2$.

[6] The heat sink according to any of [1] to [5], wherein each of the Cu—Mo composite layers has a structure in which a plurality of unit Cu—Mo composite layers are stacked with a bonding Cu layer of 75 μm or less in thickness being interposed therebetween.

[7] The heat sink according to any of [1] to [6], wherein each of the Cu—Mo composite layers has a Cu content of 10 mass % to 50 mass %.

[8] The heat sink according to any of [1] to [6], wherein each of the Cu—Mo composite layers has a Cu content of 20 mass % to 30 mass %.

[9] The heat sink according to any of [1] to [8], having a thermal conductivity in the thickness direction of 200 W/m·K or more and an average in-plane coefficient of thermal expansion from 50° C. to 800° C. of 10.0 ppm/K or less.

[10] The heat sink according to any of [1] to [9], wherein a coating or plating is formed on one side or both sides of a heat sink body composed of the stacked Cu layers and Cu—Mo composite layers.

[11] A method for manufacturing the heat sink according to any of [1] to [10], the method comprising: stacking a Cu—Mo composite material (a) having a thickness section microstructure in which Mo phase is dispersed in a Cu matrix and a Cu material (b); diffusion bonding the stacked Cu—Mo composite material (a) and Cu material (b) to obtain a laminate; and thereafter subjecting the laminate to cold rolling (x), to obtain a heat sink in which Cu—Mo composite layers formed by the Cu—Mo composite material (a) and Cu layers formed by the Cu material (b) are stacked.

[12] The method according to [11], wherein the Cu—Mo composite material (a) is obtainable by pressing a mixed powder of a Mo powder and a Cu powder to obtain a green compact, and sintering the green compact in a reducing atmosphere or in a vacuum to obtain a sintered body.

[13] The method according to [11], wherein the Cu—Mo composite material (a) is obtainable by pressing a mixed powder of a Mo powder and a Cu powder to obtain a green compact, sintering the green compact in a reducing atmosphere or in a vacuum to obtain a sintered body, and densifying the sintered body.

[14] The method according to [11], wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, and impregnating the sintered body with Cu molten in a non-oxidizing atmosphere or in a vacuum.

[15] The method according to any of [11] to [14], wherein a rolling reduction in the cold rolling (x) is 70% to 99%.

[16] The method according to [15], wherein the rolling reduction in the cold rolling (x) is 90% to 96%.

[17] The method according to any of [11] to [16], wherein the cold rolling (x) is performed by cross-rolling.

[18] The method according to [11], wherein the Cu—Mo composite material (a) is obtainable by pressing a mixed powder of a Mo powder and a Cu powder to obtain a green compact, sintering the green compact in a reducing atmosphere or in a vacuum to obtain a sintered body, densifying the sintered body, and subjecting a resultant densified Cu—Mo composite material to rolling (y).

[19] The method according to [11], wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, impregnating the sintered body with Cu molten in a non-oxidizing atmosphere or in a vacuum, and subjecting a resultant Cu—Mo composite material impregnated with Cu to rolling (y).

[20] The method according to [18] or [19], wherein a total rolling reduction of the Cu—Mo composite material (a) combining the cold rolling (x) and the rolling (y) is 70% to 99%.

[21] The method according to [20], wherein the total rolling reduction of the Cu—Mo composite material (a) combining the cold rolling (x) and the rolling (y) is 90% to 96%.

[22] The method according to any of [18] to [21], wherein the rolling (y) is performed by cross-rolling.

[23] The method according to any of [18] to [22], wherein in the case where the Cu—Mo composite material (a) is unidirectionally rolled in the rolling (y), in the cold rolling (x) the Cu—Mo composite material is rolled in a direction orthogonal to a rolling direction in the rolling (y).

[24] The method according to any of [11] to [23], wherein the Cu—Mo composite material (a) is formed by stacking a plurality of layers of unit Cu—Mo composite material ($a_u$).

[25] The method according to any of [11] to [23], wherein the Cu—Mo composite material (a) is formed by stacking a plurality of layers of unit Cu—Mo composite material ($a_u$) with a thin bonding Cu sheet being interposed therebetween.

[26] The method according to any of [11] to [25], wherein the Cu material (b) is formed by stacking a plurality of layers of unit Cu material ($b_u$).

[27] The method according to any of [11] to [26], wherein the Cu—Mo composite material (a) has a Cu content of 10 mass % to 50 mass %.

[28] The method according to any of [11] to [26], wherein the Cu—Mo composite material (a) has a Cu content of 20 mass % to 30 mass %.

[29] The method according to [27], wherein the Cu—Mo composite material (a) has a Cu content of less than 20 mass %, a total rolling reduction of the Cu—Mo composite material (a) combining the cold rolling (x) and optional rolling (y) is 70% or more, and the method comprises at least one of: (1) performing warm rolling instead of the cold rolling (x); and (2) performing the rolling (y) by warm rolling.

[30] The method according to [28], wherein a total rolling reduction of the Cu—Mo composite material (a) combining the cold rolling (x) and optional rolling (y) is 96% or more, and the method comprises at least one of: (1) performing warm rolling instead of the cold rolling (x); and (2) performing the rolling (y) by warm rolling.

[31] The method according to any of [11] to [30], comprising forming a coating or plating on one side or both sides of a heat sink body composed of the stacked Cu—Mo composite layers and Cu layers.

[32] A semiconductor package comprising the heat sink according to any of [1] to [10].

[33] A semiconductor module comprising the semiconductor package according to [32].

Advantageous Effect

The heat sink according to the present disclosure has excellent thermal properties such as a low coefficient of thermal expansion and high thermal conductivity. The manufacturing method according to the present disclosure can manufacture such a heat sink having excellent thermal properties stably at low cost.

BRIEF DESCRIPTION OF THE DRAWINGS

In the accompanying drawings:

FIG. 2 is a graph illustrating the thermal properties (the thermal conductivity in the thickness direction, the average in-plane coefficient of thermal expansion from 50° C. to 800° C.) of each heat sink in the EXAMPLES section;

FIG. 3 is a graph illustrating the thermal properties (the thermal conductivity in the thickness direction, the average in-plane coefficient of thermal expansion from 50° C. to 400° C.) of each heat sink in the EXAMPLES section;

FIG. 4 is a graph illustrating the thermal properties (the thermal conductivity in the thickness direction, the average in-plane coefficient of thermal expansion from 50° C. to 800° C.) of each heat sink in the EXAMPLES section;

FIG. 5 is a graph illustrating the thermal properties (the thermal conductivity in the thickness direction, the average in-plane coefficient of thermal expansion from 50° C. to 400° C.) of each heat sink in the EXAMPLES section;

FIG. 6 is a graph illustrating the thermal properties (the thermal conductivity in the thickness direction, the average in-plane coefficient of thermal expansion from 50° C. to 800° C.) of each heat sink in the EXAMPLES section;

FIG. 7 is a graph illustrating the thermal properties (the thermal conductivity in the thickness direction, the average in-plane coefficient of thermal expansion from 50° C. to 400° C.) of each heat sink in the EXAMPLES section; and FIG. 8 is a graph illustrating the relationship between the ratio $t_1/T$ of the thickness $t_1$ of each of the Cu layers which are the outermost layers to the thickness T and the thermal conductivity in the thickness direction in each heat sink in the EXAMPLES section.

DETAILED DESCRIPTION

Figure 1A:
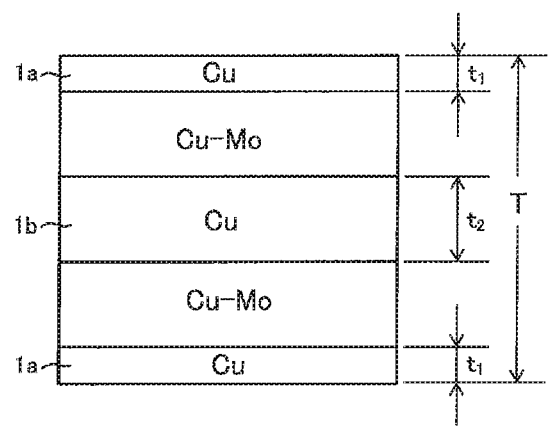
FIG. 1A is an explanatory diagram schematically illustrating a thickness section of a heat sink according to the present disclosure having a five-layer clad structure.
Figure 1B:
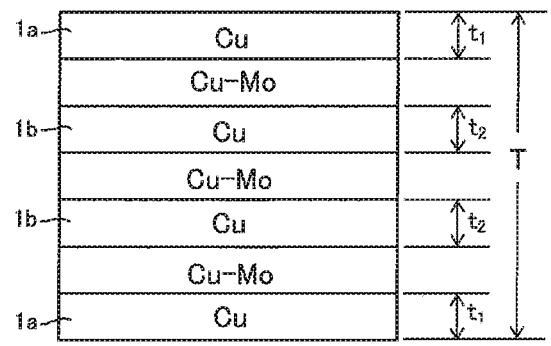
FIG. 1B is an explanatory diagram schematically illustrating a thickness section of a heat sink according to the present disclosure having a seven-layer clad structure.

A heat sink according to the present disclosure is a heat sink comprising three or more Cu layers and two or more Cu—Mo composite layers alternately stacked in a thickness direction so that two of the Cu layers are outermost layers on both sides, wherein each of the Cu—Mo composite layers has a thickness section microstructure in which flat Mo phase is dispersed in a Cu matrix. FIG. 1A schematically illustrates a thickness section of a heat sink according to the present disclosure having a five-layer clad structure. FIG. 1B schematically illustrates a thickness section of a heat sink according to the present disclosure having a seven-layer clad structure. In the drawings, reference sign 1a indicates the Cu layers which are the outermost layers on both sides, and 1b indicates each Cu layer which is an intermediate layer (i.e. intermediate Cu layer).

Each Cu—Mo composite layer and each Cu layer in the heat sink according to the present disclosure are formed by diffusion bonding the stacked Cu—Mo composite material and Cu material, and have a diffusion bonded part therebetween. This diffusion bonded part is a sound diffusion bonded part because Cu (Cu in the Cu—Mo composite material and the Cu material) of both members are diffusion bonded. For example, in the case of cladding Mo (Mo material) and Cu (Cu material), both members are bonded not by diffusion bonding but by mechanical bonding because Mo and Cu are not alloyed. With such bonding, an oxide film or fine voids tend to remain at the bonded interface, and become origins of cracking and the like. According to the present disclosure, on the other hand, Cu (Cu in the Cu—Mo composite material and the Cu material) of both members are diffusion bonded, so that a sound bonded part is obtained without an oxide film or fine voids remaining at the bonded interface.

Such a heat sink according to the present disclosure that has a clad structure of five or more layers and in which both outermost layers are Cu layers (e.g. heat sink having the Cu/(Cu—Mo)/Cu/(Cu—Mo)/Cu structure) has higher thermal conductivity than the heat sink having the Cu/(Cu—Mo)/Cu structure described in PTL 2. The reason for this is considered to be as follows. In a clad structure formed by alternately stacking a Cu layer and a Cu—Mo composite layer so that both outermost layers are Cu layers, thermal conductivity is higher in the outer layer (Cu layer) than in the inner layer (Cu—Mo composite layer), so that heat that has entered the outer layer (Cu layer) reflects/scatters at the interface between the outer layer and the inner layer and thus the heat flow is disturbed. As a result, heat cannot be transferred to the inner layer (Cu—Mo composite layer) effectively, and the interface between the outer layer and the inner layer has high heat transfer resistance. This decreases the thermal conductivity in the thickness direction. The decrease of the thermal conductivity in the thickness direction caused by this depends on the thickness of each of the Cu layers which are the outermost layers. When each of the Cu layers which are the outermost layers is thinner, the amount of heat that reflects/scatters at the interface with the inner layer is smaller, and consequently the decrease of the thermal conductivity is reduced. In comparison between the heat sink according to the present disclosure having the clad structure of five or more layers and the heat sink having the three-layer clad structure described in PTL 2, if they have the same thickness and density, then the thickness of each of the Cu layers which are the outermost layers is thinner in the heat sink according to the present disclosure, so that the heat sink according to the present disclosure has higher thermal conductivity in the thickness direction than the heat sink having the three-layer clad structure. Moreover, in the clad structure of five or more layers, each of the Cu layers which are the outermost layers can be made thinner by increasing the thickness of each intermediate Cu layer. Thus, by setting the thickness of each of the Cu layers which are the outermost layers to be less than the thickness of each intermediate Cu layer, the thermal conductivity in the thickness direction can be further increased.

Furthermore, in the heat sink according to the present disclosure, by stacking a plurality of layers of the Mo—Cu composite material and a plurality of layers of the Cu material, the restraint of the Cu layers by the Mo—Cu composite layers can be enhanced. Hence, the heat sink according to the present disclosure has a lower coefficient of thermal expansion than the heat sink having the three-layer clad structure, if they have the same thickness and density.

The number of layers (the total number of Cu layers and Cu—Mo composite layers) in the clad structure is not limited. A larger number of layers contributes to a lower coefficient of thermal expansion. Moreover, a smaller thickness of each Cu—Mo composite layer having high hardness and low ductility contributes to better press workability and thus is advantageous in press working. If the outermost layer is a Cu layer, when heat enters the heat sink, the entry of heat is made by high heat conduction of Cu. Heat, however, reflects/scatters at the interface with the next Cu—Mo composite layer having low thermal conductivity as mentioned above, as a result of which the amount of heat entering the Cu—Mo composite layer is limited. On the lower layer side, too, when heat is conducted from a Cu layer to a Cu—Mo composite layer, heat reflects/scatters at their interface as well. However, the amount of heat has already been limited, and thus the limited amount of heat is conducted, so that the decrease of the thermal conductivity at the interface is not significant. Therefore, the number of layers being seven or more is not problematic as long as the ratio of the thickness of each of the Cu layers which are the outermost layers is low (usually, the ratio of the thickness of each of the Cu layers which are the outermost layers is low in the case of seven or more layers), given that a larger number of layers contributes to a lower coefficient of thermal expansion and better press workability although the thermal conductivity in the thickness direction tends to decrease a little, and also lowers the thickness ratio of each Cu—Mo composite layer and thus decreases the heat transfer resistance of the layer. Accordingly, the number of layers is not limited, and may be determined depending on the use or the product thickness. For example, in comparison between Example 1 (five layers) and Example 11 (seven layers) and between Example 2 (five layers) and Example 12 (seven layers) in the EXAMPLES section below, the thermal conductivity is higher with seven layers. This is considered to be because the thickness ratio of each of the Cu layers which are the outermost layers is lower in Example 11 than in Example 1 and lower in Example 12 than in Example 2, as illustrated in FIG. 8.

The Cu content in each Cu—Mo composite layer is not limited, but is typically about 10 mass % to 50 mass %. With higher Cu content, cold rollability increases in the case where cold rolling is performed at a high rolling reduction, and thus the effect of decreasing the coefficient of thermal expansion by cold rolling at a high rolling reduction is enhanced. Meanwhile, in terms of enhancing the effect of restraining the thermal expansion of each intermediate Cu layer (the effect of physically restraining the intermediate Cu layer by sandwiching it from both sides), not only higher rolling reduction in the rolling but also higher Mo content is preferable. However, Mo content is in a tradeoff relationship with thermal conductivity. Besides, excessively high Mo content makes cold rolling difficult. Therefore, the Cu content in the Cu—Mo composite layer is preferably about 10 mass % to 50 mass %. In terms of the thermal properties of the heat sink, the Cu content in the Cu—Mo composite layer is preferably 30 mass % or less. If the Cu content in the Cu—Mo composite layer (Cu—Mo composite material) is less than 20 mass %, cold rollability may be impaired. Hence, in terms of the thermal properties and cold rollability of the heat sink, the Cu content in the Cu—Mo composite layer is more preferably about 20 mass % to 30 mass %.

Each Cu—Mo composite layer may be entirely composed of a Cu—Mo composite as one body. Alternatively, each Cu—Mo composite layer may have a structure in which a plurality of unit Cu—Mo composite layers are stacked with a very thin bonding Cu layer being interposed therebetween. If the thickness of the bonding Cu layer is about 75 µm or less, the thermal properties of the heat sink are hardly affected. The thickness of the bonding Cu layer is therefore preferably 75 µm or less, and more preferably 25 µm or less. The bonding Cu layer forms part of the Cu—Mo composite layer, and differs from the Cu layer alternately stacked with the Cu—Mo composite layer in the heat sink according to the present disclosure. That is, the bonding Cu layer is not included in the foregoing "Cu layer".

The heat sink according to the present disclosure is manufactured by alternately stacking a Cu—Mo composite material (a) and a Cu material (b) and diffusion bonding and then rolling the resultant laminate. The Cu—Mo composite material (a) used in the manufacture may be composed of not a sheet material alone but a plurality of thin layers of Cu—Mo composite material (unit Cu—Mo composite material) stacked together. This is because a Cu—Mo composite material has a possibility of decreasing in thickness in the case where the rolling reduction in the rolling is increased. In the case where the Cu—Mo composite material (a) is composed of a plurality of thin layers of unit Cu—Mo composite material stacked together, particularly if the Cu content in the Cu—Mo composite material is relatively low, it is preferable to stack the plurality of layers of unit Cu—Mo composite material with a thin Cu sheet (such as Cu foil) being interposed therebetween (i.e. a thin Cu sheet is interposed between adjacent layers of unit Cu—Mo composite material) and diffusion bond the layers of unit Cu—Mo composite material with the thin Cu sheet therebetween, in order to increase the bondability between the layers of unit Cu—Mo composite material. The foregoing bonding Cu layer in the Cu—Mo composite layer of the heat sink is obtained by stretching the thin Cu sheet thinner by rolling. The bonding Cu layer included in the Cu—Mo composite layer is a very thin Cu layer which is an intermediate layer, and thus its heat transfer resistance is negligibly small and hardly affects the thermal properties of the heat sink. That is, the heat sink having the bonding Cu layer in the Cu—Mo composite layer and the heat sink having no bonding Cu layer in the Cu—Mo composite layer have roughly the same thermal properties.

FIGS. 2 and 3 illustrate the thermal properties of some heat sinks in the EXAMPLES section below in an organized manner. FIG. 2 illustrates the thermal conductivity in the thickness direction (thermal conductivity at room temperature) and the average in-plane coefficient of thermal expansion from 50° C. to 800° C. FIG. 3 illustrates the thermal conductivity in the thickness direction (thermal conductivity at room temperature) and the average in-plane coefficient of thermal expansion from 50° C. to 400° C. The in-plane coefficient of thermal expansion was measured by a push-rod-type displacement detection method. For example, the average in-plane coefficient of thermal expansion from 50° C. to 400° C. was calculated by finding the difference in elongation between 50° C. and 400° C. and dividing the difference by the temperature difference of 350° C.(=400° C.-50° C.). Likewise, the average in-plane coefficient of thermal expansion from 50° C. to 800° C. was calculated. In addition, the thermal conductivity in the thickness direction (thermal conductivity at room temperature) was measured by a flash method. These thermal property measurement/calculation methods also apply to the thermal properties in FIGS. 4 to 8 described later.

FIGS. 2 and 3 illustrate the thermal properties of each heat sink composed only of a Cu—Mo composite material (Comparative Examples 7 to 10 and 13), each heat sink composed of a three-layer clad material of Cu/(Cu—Mo)/Cu structure in PTL 2 (Comparative Examples 1 and 2), and each heat sink composed of a five-layer or seven-layer clad material according to the present disclosure (Examples 1, 2, 11, and 12). In the drawings, heat sinks having approximately equal density are encircled and connected by arrows. As can be understood from the comparison of the thermal properties of heat sinks having approximately equal density, the heat sink of Cu/(Cu—Mo)/Cu structure in PTL 2 has slightly lower thermal conductivity in the thickness direction than the heat sink composed only of Cu—Mo composite material, and a significantly lower in-plane coefficient of thermal expansion than the heat sink composed only of Cu—Mo composite material. The heat sink according to the present disclosure has a lower in-plane coefficient of thermal expansion and higher thermal conductivity in the thickness direction than the heat sink of Cu/(Cu—Mo)/Cu structure.

FIGS. 4 and 5 are graphs in which Comparative Examples of Cu—Mo composite material alone that differ in Cu content are added to the graphs in FIGS. 2 and 3. FIG. 4 illustrates the thermal conductivity in the thickness direction (thermal conductivity at room temperature) and the average in-plane coefficient of thermal expansion from 50° C. to 800° C. FIG. 5 illustrates the thermal conductivity in the thickness direction (thermal conductivity at room temperature) and the average in-plane coefficient of thermal expansion from 50° C. to 400° C. Dashed lines in the drawings indicate the tendency that a Cu—Mo composite material alone having lower Cu content (higher Mo content) has lower thermal conductivity in the thickness direction and a lower in-plane coefficient of thermal expansion. As designated by arrows in the drawings, in comparison with this tendency of the thermal properties of the Cu—Mo composite material alone, the thermal properties of each heat sink of Cu/(Cu—Mo)/Cu structure in PTL 2 (Comparative Examples 1 and 2) shift toward higher thermal conductivity (thermal conductivity in the thickness direction) and a lower coefficient of thermal expansion (in-plane coefficient of thermal expansion), but the thermal properties of each heat sink according to the present disclosure further shifts toward higher thermal conductivity (thermal conductivity in the thickness direction) and a lower coefficient of thermal expansion (in-plane coefficient of thermal expansion).

FIGS. 6 and 7 are graphs in which other Examples, etc. that differ in the thickness of each of the Cu layers which are the outermost layers, the Cu content in the Cu—Mo composite layer, or the like are added to the graphs in FIGS. 4 and 5. FIG. 6 illustrates the thermal conductivity in the thickness direction (thermal conductivity at room temperature) and the average in-plane coefficient of thermal expansion from 50° C. to 800° C. FIG. 7 illustrates the thermal conductivity in the thickness direction (thermal conductivity at room temperature) and the average in-plane coefficient of thermal expansion from 50° C. to 400° C. As can be understood from the drawings, the heat sink according to the present disclosure has higher thermal conductivity (thermal conductivity in the thickness direction) and a lower coefficient of thermal expansion (in-plane coefficient of thermal expansion) than the Cu—Mo composite material alone or the heat sink of Cu/(Cu—Mo)/Cu structure in PTL 2 (Comparative Examples 1 and 2) with the same thickness and density, regardless of the thickness of each of the Cu layers which are the outermost layers, the Cu content in the Cu—Mo composite layer, and the like.

According to the foregoing principle, the heat sink according to the present disclosure has higher thermal conductivity in the thickness direction when the thickness of each of the Cu layers which are the outermost layers is smaller. In view of this, it is preferable that the thickness $t_1$ of each of the Cu layers 1a which are the outermost layers on both sides and the thickness T of the heat sink satisfy $t_1/T \leq 0.2$.

FIG. 8 illustrates the relationship between the ratio $t_1/T$ of the thickness $t_1$ of each of the Cu layers 1a which are the outermost layers to the thickness T (see FIG. 1) and the thermal conductivity in the thickness direction for each heat sink in the EXAMPLES section in an organized manner. In the drawing, heat sinks having approximately equal density are connected by solid lines. As can be understood from the drawing, when the ratio of the thickness $t_1$ of each of the Cu layers which are the outermost layers is lower, the thermal conductivity in the thickness direction is higher, indicating that $t_1/T \leq 0.2$ is preferable.

From the same perspective as above, it is preferable that the thickness $t_1$ of each of the Cu layers 1a which are the outermost layers on both sides and the thickness $t_2$ of each intermediate Cu layer 1b satisfy $t_1 \leq t_2$. As mentioned above, the thickness $t_1$ of each of the Cu layers 1a which are the outermost layers on both sides is preferably as small as possible, as it contributes to higher thermal conductivity. If $t_1 > t_2$, the thickness $t_1$ approaches the thickness of each of the Cu layers which are the outermost layers in the three-layer clad structure. This decreases the thermal conductivity improving effect according to the present disclosure.

Further preferably, the thickness $t_1$ of each of the Cu layers 1a which are the outermost layers on both sides and the thickness $t_2$ of each intermediate Cu layer 1b satisfy $t_1 < t_2$. In the case where the total number of Cu layers and Cu—Mo composite layers (the number of layers stacked) in the heat sink is nine or more (the heat sink has three or more intermediate Cu layers 1b), it is preferable that a Cu layer 1b closer to the thickness center of the heat sink has greater thickness $t_2$. The reasons for this are considered to be as follows.

In a material with thickness L, the heat flow when heat flows in the thickness direction is expressed by the following formula:

Heat flow $q(W) = CA(\theta_1 - \theta_2)$ [$\theta$: temperature, $C$: thermal conductance from point 1 to point 2, $A$: cross-sectional area of material in which heat flows]

$C = \lambda/L$ [$\lambda$: thermal conductivity (W/m·K), $L$: thickness of material (m)].

The "thermal conductance" is the amount of heat flowing per a fixed area and a fixed time when the temperature difference between both sides of the material is 1° C., and represents its ability to conduct heat. Here, the heat transfer resistance R is the inverse of C.

The heat transfer resistance $R_{CLAD}$ of the whole five-layer clad material is given by the following formula:

$$R_{CLAD} = (L_1/\lambda_{Cu}) + (L_2/\lambda_{Cu-Mo}) + (L_3/\lambda_{Cu}) + (L_4/\lambda_{Cu-Mo}) + (L_5/\lambda_{Cu}) + R_{12} + R_{23} + R_{34} + R_{45} = R_1 + R_2 + R_3 + R_4 + R_5 + R_{12} + R_{23} + R_{34} + R_{45}$$

where $L_1$ to $L_5$ respectively denote the thicknesses of the first to fifth layers, $\lambda_{Cu}$ denotes the thermal conductivity of each Cu layer, $\lambda_{Cu-Mo}$ denotes the thermal conductivity of each Cu—Mo composite layer, $R_1$, $R_2$, $R_3$, $R_4$, and $R_5$ denote the heat transfer resistances of the respective layers, $R_{12}$, $R_{23}$, $R_{34}$, and $R_{45}$ denote the heat transfer resistances of the respective layer interfaces, and 12, 23, 23, and 45 denote the layer interfaces (between the layers) from above.

Here, $R_{12}$, $R_{23}$, $R_{34}$, and $R_{45}$ each represent the degree of disturbance of heat flow by heat reflection and thermal scattering not in the material but in the interface, i.e. the load (resistance).

Consider the heat flow from the first layer to the fifth layer in a five-layer clad material. The heat flow is reduced when entering from the Cu layer which is the first layer (outermost layer) with low $R_1$ into the Cu—Mo composite layer which is the second layer with high $R_2$. In the Cu layer which is the first layer, the heat transfer resistance $R_{12}$ of the interface is added to the heat transfer resistance $R_1$ of the Cu layer. If the thickness $L_1$ of the Cu layer which is the first layer (outermost layer) is small, $R_1$ is low, and the amount of heat flow added in the Cu layer due to heat reflection and thermal scattering is small, so that $R_{12}$ decreases accordingly. If the thickness approaches zero, both $R_1$ and $R_{12}$ approach zero. At the interface between the Cu—Mo composite layer which is the second layer and the Cu layer which is the third layer, heat enters from the layer with high heat transfer resistance to the layer with low heat transfer resistance. Moreover, the Cu phase in the Cu—Mo composite layer and the Cu layer are completely diffusion bonded to form one body, and thus there is a continuity of Cu. Hence, $R_{23}$ can be regarded as approximately zero. Likewise, $R_{45}$ can be regarded as approximately zero. To the heat transfer resistance $R_3$ of the Cu layer which is the third layer, the heat transfer resistance $R_{34}$ of the interface with the Cu—Mo composite layer which is the fourth layer is added. Here, since the heat flow that has passed through the Cu—Mo composite layer which is the second layer and has been reduced enters the Cu layer which is the third layer, $R_{34}$ is less than $R_{12}$ even in the case where the thickness $L_1$ of the Cu layer which is the first layer and the thickness $L_3$ of the Cu layer which is the third layer are the same. More detailed description will be given below (each heat flow amount in the description is a provisional value). Suppose the Cu—Mo composite layers have the same thickness and the Cu layers have the same thickness in the five-layer clad material. When heat flow of 100 first enters the Cu layer which is the first layer, the heat flow is subjected to heat transfer resistance of $(L_1/\lambda_{Cu})+R_{12}$ in the Cu layer which is the first layer, and as a result reduced to 80. The heat flow is then subjected to heat transfer resistance of $(L_2/\lambda_{Cu-Mo})+R_{23}$ ($R_{23}\approx 0$) in the Cu—Mo composite layer which is the second layer, and reduced to 60. The heat flow then enters the Cu layer which is the third layer. $R_{34}$ when entering from the Cu layer which is the third layer into the Cu—Mo composite layer which is the fourth layer is not heat transfer resistance from heat flow of 100 but heat transfer resistance from heat flow of 60, and therefore $R_{12}>R_{34}$. In view of the above, by making each of the Cu layers which are the outermost layers thinner than each inside (intermediate) Cu layer, the heat transfer resistance $R_{CLAD}$ of the whole clad material is reduced.

For the reasons stated above, in the case where the total number of layers in the heat sink is nine or more (the heat sink has three or more intermediate Cu layers 1b), it is preferable that a Cu layer closer to the heat sink inside (thickness center) is thicker. In addition, by increasing the thickness of each combination of a Cu layer and a Cu—Mo composite layer in the direction toward the heat sink inside (thickness center) from a combination of a thin Cu layer and a thin Cu—Mo composite layer on the outer layer side (heat entry side), the reflection and scattering of heat flow at each interface are likely to be reduced. It is therefore preferable to increase not only the thickness of each Cu layer but also the thickness of each Cu—Mo composite layer in the direction toward the heat sink inside (thickness center).

In each five-layer clad material (Example) in the EXAMPLES section below, the thickness $t_1$ of each of the Cu layers 1a which are the outermost layers on both sides and the thickness $t_2$ of each intermediate Cu layer 1b satisfy $t_1 < t_2$. Regarding the degree of $t_1 < t_2$, $t_1/t_2 \leq 0.4$ in Examples 3 to 10 and 13 to 21, $t_1/t_2 \leq 0.1$ in Examples 3 to 8, 13 to 17, and 19 to 21, and $t_1/t_2 \leq 0.06$ in Examples 3 to 6, 13 to 16, and 19 to 21.

The respective thicknesses of the Cu—Mo composite layer and the Cu layer, the layer thickness ratio between the Cu—Mo composite layer and the Cu layer, the thickness of the heat sink, etc. are not limited. The structure is preferably symmetric in the thickness direction with respect to the center Cu layer in the thickness direction (i.e. symmetric in the thicknesses of the Cu layer and the Cu—Mo composite layer), in order to ensure thermal properties and also prevent deflection, strain, and the like during rolling or during use. The thickness of the heat sink is not limited, but is typically about 1 mm.

No lower limit is placed on the thickness $t_1$ of each of the Cu layers 1a which are the outermost layers. However, if the thickness $t_1$ is excessively small, manufacture as a clad material is difficult. Besides, the thickness of each intermediate Cu layer increases, and the coefficient of thermal expansion increases. The practical lower limit is therefore about 0.01 mm.

Regarding the layer thickness ratio between the Cu—Mo composite layer and the Cu layer, if the layer thickness ratio of the Cu layer to the Cu—Mo composite layer is high, the thermal conductivity is high, but the restraint of the intermediate Cu layer by the Cu—Mo composite layer is weak and the coefficient of thermal expansion is high. If the layer thickness ratio of the Cu layer is low, the coefficient of thermal expansion is low, but the thermal conductivity is low. The layer thickness ratio between the Cu—Mo composite layer and the Cu layer may be selected as appropriate depending on desired thermal properties (thermal conductivity, coefficient of thermal expansion). In terms of reducing the coefficient of thermal expansion at low temperature (e.g. 200° C., 400° C.), it is desirable not to significantly increase the thickness of the Cu layer relative to the Cu—Mo composite layer.

The Cu content in the Cu—Mo composite layer and the layer thickness ratio between the Cu—Mo composite layer and the Cu layer are linked to the density of the heat sink. Accordingly, the density is preferably about 9.25 g/cm³ to 9.55 g/cm³, and particularly preferably about 9.30 g/cm³ to 9.45 g/cm³.

The heat sink according to the present disclosure is manufactured by diffusion bonding and then rolling a Cu—Mo composite material and a Cu material produced beforehand. Since rolling may also be performed in the Cu—Mo composite material manufacturing process, the heat sink as a whole has a rolled microstructure. Moreover, the Mo phase dispersed in the Cu matrix in the Cu—Mo composite layer is stretched flat, and the aspect ratio (aspect ratio in the rolling direction) of the Mo phase in the thickness section microstructure is typically more than 2. The aspect ratio herein is the major axis/minor axis (length ratio) of the Mo phase in the thickness section microstructure in the rolling direction. For example, the thickness section microstructure (ion-milling-finished thickness section microstructure) in the rolling direction is observed by an SEM, the major axis/minor axis of each particle of the Mo phase included in any one observation field is calculated, and their average value is taken to be the aspect ratio.

The Mo phase dispersed in the Cu matrix in the Cu—Mo composite layer has a different flat-stretched form depending on, for example, the Mo content and the rolling type (unidirectional rolling, cross-rolling) of the Cu—Mo composite layer. For example, in the case where the Mo content in the Cu—Mo composite layer is relatively low, the flat-stretched Mo phase has a pattern similar to islands separated from each other. In the case where the Mo content is high, the particles of the flat-stretched Mo phase connect to each other, creating a form (rolled microstructure) like a striped or marble pattern in which such Mo phase is mixed with the Cu matrix. In the latter case, the aspect ratio may be unable to be specifically quantified although it is clearly more than 2.

A semiconductor package in which the heat sink according to the present disclosure is mainly used is repeatedly heated from normal temperature (which may be about −50° C. in cold climates) to about 200° C. during semiconductor operation, as the semiconductor repeats operation and pause. To suppress thermal fatigue, the heat sink needs to have a low coefficient of thermal expansion. It is important that the coefficient of thermal expansion is low up to about 800° C. in applications involving brazing bonding, and up to about 400° C. in applications involving soldering bonding. Meanwhile, the heat sink needs to have high thermal conductivity especially in the thickness direction, in order to achieve high heat-sink property.

The heat sink according to the present disclosure has excellent thermal properties including both high thermal conductivity and a low coefficient of thermal expansion. Specifically, the thermal conductivity in the thickness direction (thermal conductivity at room temperature) is preferably 200 W/m·K or more, and more preferably 250 W/m·K or more. The average in-plane coefficient of thermal expansion from 50° C. to 800° C. is preferably 10.0 ppm/K or less, and more preferably 8.0 ppm/K or less.

The heat sink according to the present disclosure may have a coating or plating such as a Ni coating or plating on its surface, for corrosion protection or for bonding (brazing bonding or soldering bonding) to another member. This coating or plating is formed with such a thickness that does not significantly affect the thermal properties of the heat sink. The type of the coating or plating is not limited. Examples include a Ni coating or plating, a Au coating or plating, and a Ag coating or plating. These coatings or platings may be used singly or in combination of two or more layers. The coating or plating may be formed on only one side of the heat sink (i.e. on the surface of one of the two Cu layers which are the outermost layers), or on both sides of the heat sink.

Depending on the material of the heat sink, to improve coatability or platability when forming a coating or plating such as a Ni coating or plating on the heat sink surface, a Cu coating or plating is formed as a base film in some cases. The heat sink according to the present disclosure does not need such a base film, because the outermost layers are Cu layers.

A method for manufacturing the above-described heat sink according to the present disclosure will be described below.

In one embodiment of the method for manufacturing the heat sink according to the present disclosure, a Cu—Mo composite material (a) having a thickness section microstructure in which Mo phase is dispersed in a Cu matrix and a Cu material (b) are stacked, and the stacked Cu—Mo composite material (a) and Cu material (b) are diffusion bonded to obtain a laminate, and then the laminate is subjected to cold rolling (x) to obtain a heat sink in which Cu—Mo composite layers formed by the Cu—Mo composite material (a) and Cu layers formed by the Cu material (b) are stacked. Here, the Cu—Mo composite material (a) is produced beforehand. The Cu—Mo composite material (a) may be produced by a method (e.g. any of the below-described methods (i) to (iii)) not involving rolling, or produced by a method (e.g. the below-described method (iv) or (v)) involving rolling (y).

In another embodiment of the method for manufacturing the heat sink according to the present disclosure, in the case where the Cu content in the Cu—Mo composite material (a) is relatively low, warm rolling of the following (1) and/or (2) is performed to prevent, for example, edge cracks caused by cold rolling. These manufacturing methods will be described in detail later.

(1) Perform warm rolling instead of cold rolling (x).
(2) Perform rolling (y) by warm rolling.

The thicknesses of the Cu—Mo composite material (a) and the Cu material (b) are selected as appropriate depending on the thicknesses of the Cu—Mo composite layer and the Cu layer of the heat sink to be manufactured.

The Cu—Mo composite material (a) and the Cu material (b) may be each composed of a sheet material alone. The Cu—Mo composite material (a) may be composed of a plurality of thin layers of Cu—Mo composite material (unit Cu—Mo composite material ($a_u$)) stacked together. The Cu material (b) may be composed of a plurality of thin layers of Cu material (unit Cu material ($b_u$)) stacked together. This is because a Cu—Mo composite material and a Cu material have a possibility of decreasing in thickness in the case where the rolling reduction in the rolling is increased. In such a case, the laminate is formed by diffusion bonding any of: (1) the stacked Cu—Mo composite material (a) composed of a plurality of layers of unit Cu—Mo composite material ($a_u$) and Cu material (b) alone; (2) the stacked Cu—Mo composite material (a) alone and Cu material (b) composed of a plurality of layers of unit Cu material ($b_u$); and (3) the stacked Cu—Mo composite material (a) composed of a plurality of layers of unit Cu—Mo composite material ($a_u$) and Cu material (b) composed of a plurality of layers of unit Cu material ($b_u$).

In the case where the Cu—Mo composite material (a) is composed of a plurality of layers of unit Cu—Mo composite material ($a_u$) stacked together as described above, it is preferable to stack the plurality of layers of unit Cu—Mo composite material ($a_u$) with a thin Cu sheet (such as Cu foil) being interposed therebetween (i.e. a thin Cu sheet is interposed between adjacent layers of unit Cu—Mo composite material ($a_u$)) and diffusion bond the layers of unit Cu—Mo composite material ($a_u$) with the thin Cu sheet therebetween, in order to increase the bondability between the layers of unit Cu—Mo composite material ($a_u$). The foregoing bonding Cu layer in the Cu—Mo composite layer of the heat sink is obtained by stretching the thin Cu sheet thinner by rolling. Hence, the thickness of the thin Cu sheet is preferably such that the thickness of the bonding Cu layer in the Cu—Mo composite layer in the heat sink is 75 μm or less (more preferably 25 μm or less).

The method of diffusion bonding the stacked Cu—Mo composite material (a) and Cu material (b) is not limited, but diffusion bonding is preferably performed by spark plasma sintering (SPS) or hot pressing.

As the Cu—Mo composite material (a), any of the below-described materials may be used. As the Cu material (b), a pure Cu sheet (such as pure Cu foil) is typically used.

As mentioned earlier, a Cu—Mo composite material is qualitatively known to decrease in coefficient of thermal expansion as a result of rolling. Hence, conventional techniques involve rolling the Cu—Mo composite material. It is considered that Mo particles resist deformation by rolling as Mo particles are hard and small as primary particles. Accordingly, warm rolling at about 200° C. to 400° C. is solely employed as the rolling of the Cu—Mo composite material. While some proposed methods use cold rolling in secondary rolling of a 65 mass % Mo-35 mass % Cu composite material, the method uses warm rolling in primary rolling.

However, regarding such conventional recognition and manufacturing methods based on the recognition, we discovered the following: If a Cu—Mo composite material (in particular, a Cu—Mo composite material whose Cu content is not relatively low) is rolled by warm rolling, the effect of decreasing the coefficient of thermal expansion is low because the deformation of Mo particles does not progress appropriately. If the Cu—Mo composite material is rolled by cold rolling, on the other hand, the deformation of Mo particles progresses appropriately and the coefficient of thermal expansion is decreased effectively. In the case where the Cu content in the Cu—Mo composite material is relatively low (e.g. less than 20 mass %), cold rolling causes edge cracks and the like depending on the rolling reduction, so that it may be preferable to perform the whole or part of the rolling by warm rolling. In the case where the Cu content is 20 mass % or more and the rolling reduction is not extremely high, a favorable rolled sheet can be obtained without significant edge cracks by rolling the Cu—Mo composite material only by cold rolling. The reason why the plastic deformation form of Mo particles greatly differs between warm rolling and cold rolling is considered as follows.

In the case of rolling the Cu—Mo composite material, there is tendency that, due to the difference in yield stress between Mo and Cu, Mo particles change in relative position in the Cu matrix rather than deforming in the initial stage of the rolling, and deform as the rolling progresses and the Mo particles come into contact with each other in the thickness direction. With cold rolling, Cu undergoes work hardening, so that Mo particles can be deformed by Cu phase as the rolling progresses. This enables the deformation of Mo particles to progress appropriately. With warm rolling, on the other hand, Mo particles change in relative position in the Cu matrix more easily, and Cu is unlikely to be work hardened. Accordingly, the effect of deforming Mo particles by Cu phase is insufficient as compared with cold rolling, and the deformation of Mo particles does not progress appropriately.

This difference in the plastic deformation form of Mo particles in the Cu—Mo composite material is more obvious when the Cu content in the Cu—Mo composite material is higher. The reason for this is considered as follows. With warm rolling, work hardening of Cu cannot be used, and also Mo particles easily change in relative position in the Cu matrix because of high Cu content. With cold rolling, the influence of work hardening of Cu is higher because of high Cu content. Cu not only has high thermal conductivity but also has a high coefficient of thermal expansion. Therefore, higher Cu content in the Cu—Mo composite material is likely to cause a problem in terms of the coefficient of thermal expansion. However, the coefficient of thermal expansion of the Cu—Mo composite material can be effectively decreased by performing cold rolling at a predetermined high rolling reduction. Moreover, even in the case where warm rolling is employed as part of the rolling so as to use cold rolling and warm rolling in combination as described later, the cold rolling is expected to have an effect of decreasing the coefficient of thermal expansion.

Even in the case where the Cu content in the Cu—Mo composite material is relatively low (e.g. Cu content of 30 mass % or less), the same effect as above can be achieved although to a lesser degree. In the case where the Cu content in the Cu—Mo composite material is relatively low, the restraint by Mo is enhanced as mentioned earlier, which is expected to have an effect of decreasing the coefficient of thermal expansion.

The Cu—Mo composite material (a) is produced beforehand. As the Cu—Mo composite material (a), for example, a Cu—Mo composite material obtainable by any of the following methods (i) to (iii) may be used.

(i) Cu—Mo composite material (a) obtainable by pressing a mixed powder of a Mo powder and a Cu powder to obtain a green compact, and sintering the green compact in a reducing atmosphere or in a vacuum to obtain a sintered body.

(ii) Cu—Mo composite material (a) obtainable by pressing a mixed powder of a Mo powder and a Cu powder to obtain a green compact, sintering the green compact in a reducing atmosphere or in a vacuum to obtain a sintered body, and densifying the sintered body.

(iii) Cu—Mo composite material (a) obtainable by pressing a Mo powder or a mixed powder of a Mo powder and a Cu powder to obtain a green compact, sintering the green compact in a reducing atmosphere or in a vacuum to obtain a sintered body, and impregnating the sintered body with Cu molten in a non-oxidizing atmosphere or in a vacuum.

Since the Cu—Mo composite material (a) obtained by any of these methods (i) to (iii) has not been cold rolled, the cold rolling (x) of the clad material is preferably performed at a rolling reduction of 70% to 99%, more preferably performed at a rolling reduction of 80% to 99%, and particularly preferably performed at a rolling reduction of 90% to 96%. This rolling reduction is also the rolling reduction of the Cu—Mo composite material (a). As a result of performing cold rolling at a high rolling reduction, the effect of decreasing the coefficient of thermal expansion can be achieved. If the rolling reduction is excessively high, the thermal conductivity tends to decrease. Accordingly, the upper limit of the rolling reduction is 99%, and is preferably 96%. Thus, the coefficient of thermal expansion can be decreased effectively while suppressing a decrease in thermal conductivity. The cold rolling (x) is performed in a plurality of passes.

The cold rolling (x) may be unidirectional rolling. Alternatively, the cold rolling (x) may be cross-rolling, i.e. rolling in two directions orthogonal to each other, in order to reduce the difference in the coefficient of thermal expansion between two directions (X-axis direction and Y-axis direction) orthogonal to each other in the heat sink plane and reduce in-plane anisotropy. Different rolling reductions may be used in the rolling in the two orthogonal directions. To obtain a rolled sheet having uniform thermal properties with no difference in the coefficient of thermal expansion between the X-axis direction and the Y-axis direction, however, it is preferable to use the same rolling reduction.

As the Cu—Mo composite material (a), a Cu—Mo composite material obtainable by the following method (iv) or (v) may be used.

(iv) Cu—Mo composite material (a) obtainable by pressing a mixed powder of a Mo powder and a Cu powder to obtain a green compact, sintering the green compact in a reducing atmosphere or in a vacuum to obtain a sintered body, densifying the sintered body, and subjecting the resultant densified Cu—Mo composite material to rolling (y).

(v) Cu—Mo composite material (a) obtainable by pressing a Mo powder or a mixed powder of a Mo powder and a Cu powder to obtain a green compact, sintering the green compact in a reducing atmosphere or in a vacuum to obtain a sintered body, impregnating the sintered body with Cu molten in a non-oxidizing atmosphere or in a vacuum, and subjecting the resultant Cu—Mo composite material impregnated with Cu to rolling (y).

The rolling (y) may be performed by cold rolling. Even in the case where the Cu content in the Cu—Mo composite material (a) is 30 mass % or less, the rolling (y) may be performed by cold rolling. Alternatively, the rolling (y) may be performed by warm rolling depending on circumstances. The rolling (y) may be unidirectional rolling. Alternatively, the rolling (y) may be cross-rolling, i.e. rolling in two directions orthogonal to each other, in order to reduce the difference in the coefficient of thermal expansion between two directions (X-axis direction and Y-axis direction) orthogonal to each other in the heat sink plane and reduce in-plane anisotropy. Different rolling reductions may be used in the rolling in the two orthogonal directions. To obtain a Cu—Mo composite material (a) having uniform thermal properties with no difference in the coefficient of thermal expansion between the X-axis direction and the Y-axis direction, however, it is preferable to use the same rolling reduction.

Since the Cu—Mo composite material (a) obtained by the method (iv) or (v) has been subjected to the rolling (y), the cold rolling (x) of the clad material is preferably performed at such a rolling reduction that the total rolling reduction of the Cu—Mo composite material (a) combining the cold rolling (x) and the rolling (y) is 70% to 99%, more preferably performed at such a rolling reduction that the total rolling reduction is 80% to 99%, and particularly preferably performed at such a rolling reduction that the total rolling reduction is 90% to 96%. The reason for this is the same as the above. In the case where the Cu—Mo composite material (a) is unidirectionally rolled in the rolling (y), in the cold rolling (x) the Cu—Mo composite material may be rolled in a direction orthogonal to the rolling direction in the rolling (y).

In the manufacture of the heat sink according to the present disclosure, in the case where the Cu content in the Cu—Mo composite material (a) is relatively low, a manufacturing method involving warm rolling (including a manufacturing method that does not perform the rolling (y) on the Cu—Mo composite material (a)) is preferably used to prevent, for example, edge cracks caused by cold rolling, although depending on the total rolling reduction of the material. In this manufacturing method, for example, warm rolling is preferably performed under the following conditions.

In the case where the total rolling reduction of the material (the total rolling reduction of the rolling reduction of the Cu—Mo composite material alone and the rolling reduction of the Cu—Mo composite material in clad material rolling) is 70% or more and the Cu content in the Cu—Mo composite material (a) is less than 20 mass %, it is preferable to perform warm rolling of the following (1) and/or (2). Particularly in the case where the Cu content is 15 mass % or less, it is preferable to perform warm rolling of the following (1) and (2). In the case where the Cu content in the Cu—Mo composite material (a) is 20 mass % to 30 mass % and the total rolling reduction of the material is particularly high (e.g. total rolling reduction of 96% or more), too, it is preferable to perform warm rolling of the following (1) and/or (2).

(1) Perform warm rolling instead of the cold rolling (x).
(2) Perform the rolling (y) by warm rolling.

As mentioned earlier, with warm rolling, Mo particles change in relative position in the Cu matrix more easily, and Cu is unlikely to be work hardened. Accordingly, the effect of deforming Mo particles by Cu phase is insufficient as compared with cold rolling, and the proportion of decrease of the coefficient of thermal expansion by rolling tends to be lower than that by cold rolling. In the case where the Cu content in the Cu—Mo composite material is low, however, the relative position change of Cu phase and Mo particles is unlikely to occur because the distance between Mo particles is shorter, and Mo particles are deformed easily. Performing warm rolling in such conditions can yield a heat sink having thermal properties not significantly different from those in the case of performing cold rolling.

The warm rolling is preferably performed at a temperature of about 200° C. to 300° C. If the temperature of the warm rolling is more than 300° C., Mo oxidizes, which facilitates the formation of surface oxide. Such surface oxide tends to exfoliate during the rolling and adversely affect the quality of the product.

In the case of performing warm rolling of either (1) or (2), one of (1) and (2) is selected based on rollability depending on the Cu content, thickness, and the like of the Cu—Mo composite material (a).

The steps in the methods (i) to (v) for obtaining the Cu—Mo composite material (a) will be described below.

Hereafter, a step of pressing a Mo powder or a mixed powder of a Mo powder and a Cu powder to obtain a green compact is referred to as step (A), a step of sintering the green compact in a reducing atmosphere or in a vacuum to obtain a sintered body is referred to as step (B), a step of impregnating the sintered body with Cu molten in a non-oxidizing atmosphere or in a vacuum is referred to as step (C1), a step of densifying the sintered body is referred to as step (C2), and a step of subjecting the Cu-infiltrated or densified Cu—Mo composite material to rolling (y) is referred to as step (D).

In step (A), a Mo powder or a mixed powder of a Mo powder and a Cu powder is pressed to obtain a green compact according to a conventional method. The above-described methods of manufacturing the Cu—Mo composite material (a) include the case where Cu infiltration is performed after sintering the green compact (step (C1)) and the case where densification is performed without infiltration after sintering the green compact (step (C1)). In the latter case, the amount of Cu powder appropriate to the Cu content in the Cu—Mo composite material (a) is contained.

The purity and the particle size of each of the Mo powder and the Cu powder used are not limited. Typically, the Mo powder has a purity of 99.95 mass % or more and a FSSS average particle size of about 1 μm to 8 μm, and the Cu powder is pure Cu, such as an electrolytic copper powder or an atomized copper powder, with an average particle size D50 of about 5 μm to 50 μm.

In step (A), a Mo powder or a mixed powder of a Mo powder and a Cu powder is charged into a mold, and pressed while adjusting pressure according to the filling ability of the mixed powder used and the target forming density of the green compact, to obtain a green compact.

In step (B), the green compact obtained in step (A) is sintered in a reducing atmosphere (e.g. hydrogen atmosphere) or in a vacuum, to obtain a sintered body. The sintering may be performed under typical conditions. In the case where the green compact is made of a mixed powder of a Mo powder and a Cu powder, the sintering is preferably performed under conditions of holding at a temperature of about 900° C. to 1050° C. (preferably 950° C. to 1000° C.) for about 30 min to 1000 min. In the case where the green compact is made of a Mo powder, the sintering is preferably performed under conditions of holding at a temperature of about 1100° C. to 1400° C. (preferably 1200° C. to 1300° C.) for about 30 min to 1000 min.

In step (C1), the sintered body (porous body) obtained in step (B) is impregnated with Cu molten in a non-oxidizing atmosphere or in a vacuum (Cu infiltration), to obtain a Cu—Mo composite material (a). In the case of performing step (C1), desired Cu content is ensured by Cu infiltration.

The Cu infiltration may be performed under typical conditions. For example, a Cu sheet or a Cu powder is placed on the upper surface and/or the lower surface of the sintered body, and held at a temperature of about 1083° C. to 1300° C. (preferably 1150° C. to 1250° C.) for 20 min to 600 min. The non-oxidizing atmosphere is not limited, but is preferably a hydrogen atmosphere. In terms of improving workability after infiltration, infiltration in a vacuum is preferable.

In the case of performing step (B) and step (C1) in sequence, in a state in which a Cu sheet or a Cu powder for Cu infiltration is placed on the green compact obtained in step (A), the green compact may be first heated to the sintering temperature to perform step (B) and then heated to the Cu infiltration temperature to perform step (C1).

The Cu—Mo composite material (infiltrated body) obtained in step (C1) is preferably subjected to surface grinding (e.g. surface grinding using a milling machine or a whetstone) to remove excess pure Cu remaining on the surface, prior to the cold rolling in the next step.

In step (C2) as an alternative to step (C1), the sintered body obtained in step (B) is densified to obtain a Cu—Mo composite material (a). In this case, after the sintering in step (B), the temperature may be further increased to melt Cu (a process of holding at about 1200° C. to 1300° C. for about 20 min to 120 min), before the densification in step (C2).

The densification requires high temperature and pressure, and may be performed by a method such as hot pressing, spark plasma sintering (SPS), or heat rolling. Through the densification process, the sintered body is densified by reducing voids in the sintered body, thus increasing the relative density.

In step (D), the Cu—Mo composite material obtained in step (C1) or (C2) is subjected to rolling (y) at a predetermined rolling reduction, in order to decrease the coefficient of thermal expansion of the Cu—Mo composite material (a).

Before rolling the Cu—Mo composite material obtained in step (C1) or (C2), the Cu—Mo composite material may be optionally subjected to homogenization aging heat treatment at a temperature of about 800° C. to 1000° C.

The heat sink according to the present disclosure as cold rolled or warm rolled or after softening aging heat treatment can be used as a product. A coating or plating such as a Ni coating or plating may be optionally formed on the surface of the heat sink, in order to improve performance such as corrosion resistance and electrolytic corrosion resistance for use as a base of a semiconductor. This coating or plating is formed with such a thickness that does not significantly affect the thermal properties of the heat sink. The type of the coating or plating is not limited. Examples include a Ni coating or plating, a Au coating or plating, and a Ag coating or plating. These coatings or platings may be used singly or in combination of two or more layers. The coating or plating may be formed on only one side of the heat sink (i.e. on the surface of one of the two Cu layers which are the outermost layers), or on both sides of the heat sink.

The heat sink according to the present disclosure is suitable for use in semiconductor packages such as ceramic packages or metal packages included in various semiconductor modules, and exhibits high heat-sink property and tolerance. In particular, the heat sink according to the present disclosure can, while having high thermal conductivity, maintain a low coefficient of thermal expansion even after exposed to high temperature of more than 800° C., and therefore can be appropriately used in applications involving brazing bonding that requires a high bonding temperature of 750° C. or more.

EXAMPLES (1) Manufacturing Conditions of Cu—Mo Composite Material

A mixed powder produced by mixing a Mo powder (FSSS average particle size: 6 μm) and a pure Cu powder (average particle size D50: 5 μm) in a predetermined proportion was put in a mold (50 mm×50 mm) and pressed, to obtain a green compact with a thickness corresponding to the rolling reduction in cold rolling in a subsequent step. The green compact was sintered (1000° C., 600 min) in a hydrogen atmosphere, to obtain a sintered body. A pure Cu sheet was placed on the upper surface of the sintered body, and heated to 1200° C. in a hydrogen atmosphere (holding time: 180 min) to melt the pure Cu sheet and cause the sintered body to be impregnated with the molten Cu, thus obtaining a Cu—Mo composite material having a predetermined Cu content. After removing Cu remaining on the surface of the Cu—Mo composite material using a milling machine, the Cu—Mo composite material was subjected to unidirectional rolling (y) (cold rolling) at a predetermined rolling reduction, to produce a Cu—Mo composite material.

(2) Manufacturing Conditions of Each Test Piece
(2.1) Example

The Cu—Mo composite material with the predetermined thickness obtained as described above and a pure Cu sheet were stacked to form a five-layer structure of Cu/(Cu—Mo)/Cu/(Cu—Mo)/Cu or a seven-layer structure of Cu/(Cu—Mo)/Cu/(Cu—Mo)/Cu/(Cu—Mo)/Cu. The stacked Cu—Mo composite material and Cu material were diffusion bonded using a spark plasma sintering (SPS) device (DR. SINTER SPS-1050 produced by Sumitomo Coal Mining Co., Ltd.), under conditions of 950° C., a holding time of 18 min, and a pressing force of 20 MPa, to obtain a laminate. The laminate was then subjected to rolling (cold rolling) in a direction orthogonal to the rolling direction of the rolling (y) (cold rolling) of the Cu—Mo composite material at the same rolling reduction as the rolling (y), to manufacture a heat sink (thickness: 1 mm) of Example.

(2.2) Comparative Example

A heat sink (thickness: 1 mm) of Comparative Example was manufactured under the same conditions as Example except that the Cu—Mo composite material and the pure Cu sheet formed a three-layer structure of Cu/(Cu—Mo)/Cu (Comparative Examples 1, 2, and 11).

The Cu—Mo composite material alone was also used as a heat sink (thickness: 1 mm) of Comparative Example (Comparative Examples 3 to 10 and 12 to 14).

(3) Measurement of Thermal Properties

For each test piece, the in-plane coefficient of thermal expansion was measured by a pushrod-type displacement detection method. The difference in elongation between 50° C. and 400° C. and the difference in elongation between 50° C. and 800° C. were each divided by the temperature difference, to calculate the average in-plane coefficient of thermal expansion from 50° C. to 400° C. and the average in-plane coefficient of thermal expansion from 50° C. to 800° C. In addition, the thermal conductivity in the thickness direction (thermal conductivity at room temperature) was measured by a flash method.

(4) Evaluation of Thermal Properties

The thermal properties of each test piece are shown in Tables 1 to 6 together with the manufacturing conditions. As shown in the tables, Examples had considerably higher thermal conductivity in the thickness direction than Comparative Examples.

TABLE 1

| No. | Type | Clad structure *3 | Clad conditions *1 *2 | | | | |
|---|---|---|---|---|---|---|---|
| | | | Cu content of Cu—Mo (mass %) | Outermost Cu layer thickness (mm) | Intermediate Cu layer thickness (mm) | Total thickness of all Cu layers (mm) | Outermost Cu layer thickness/ thickness (—) |
| Comparative Example 1 | Three-layer clad material | Cu/Cu—Mo/Cu (1.5) (2.0) (1.5) | 25 | 0.30 | — | 0.60 | 0.30 |
| Comparative Example 2 | Three-layer clad material | Cu/Cu—Mo/Cu (1.2) (2.4) (1.2) | 25 | 0.26 | — | 0.52 | 0.26 |
| Example 1 | Five-layer clad material | Cu/Cu—Mo/Cu/Cu—Mo/Cu (1.0) (1.0) (1.0) (1.0) (1.0) | 25 | 0.20 | 0.21 | 0.61 | 0.20 |
| Example 2 | Five-layer clad material | Cu/Cu—Mo/Cu/Cu—Mo/Cu (0.8) (1.2) (0.8) (1.2) (0.8) | 25 | 0.17 | 0.18 | 0.51 | 0.17 |
| Example 3 | Five-layer clad material | Cu/Cu—Mo/Cu/Cu—Mo/Cu (0.05) (1.0) (2.9) (1.0) (0.05) | 25 | 0.01 | 0.59 | 0.61 | 0.01 |
| Example 4 | Five-layer clad material | Cu/Cu—Mo/Cu/Cu—Mo/Cu (0.05) (1.2) (2.3) (1.2) (0.05) | 25 | 0.01 | 0.47 | 0.49 | 0.01 |
| Example 5 | Five-layer clad material | Cu/Cu—Mo/Cu/Cu—Mo/Cu (0.1) (1.0) (2.8) (1.0) (0.1) | 25 | 0.02 | 0.56 | 0.60 | 0.02 |
| Example 6 | Five-layer clad material | Cu/Cu—Mo/Cu/Cu—Mo/Cu (0.1) (1.2) (2.2) (1.2) (0.1) | 25 | 0.02 | 0.45 | 0.49 | 0.02 |
| Example 7 | Five-layer clad material | Cu/Cu—Mo/Cu/Cu—Mo/Cu (0.2) (1.0) (2.6) (1.0) (0.2) | 25 | 0.04 | 0.53 | 0.61 | 0.04 |
| Example 8 | Five-layer clad material | Cu/Cu—Mo/Cu/Cu—Mo/Cu (0.2) (1.2) (2.0) (1.2) (0.2) | 25 | 0.04 | 0.42 | 0.50 | 0.04 |
| Example 9 | Five-layer clad material | Cu/Cu—Mo/Cu/Cu—Mo/Cu (0.5) (1.0) (2.0) (1.0) (0.5) | 25 | 0.10 | 0.40 | 0.60 | 0.10 |

*1 Cu: Cu material, Cu—Mo: Cu—Mo composite material
*2 Outermost Cu layer thickness: thickness of Cu layer which is outermost layer Intermediate Cu layer thickness: thickness of Cu layer which is intermediate layer
*3 The numbers in brackets are thicknesses of respective materials before cladding (mm)

TABLE 2

| No. | Type | Clad structure *3 | Clad conditions *1 *2 | | | | |
|---|---|---|---|---|---|---|---|
| | | | Cu content of Cu—Mo (mass %) | Outermost Cu layer thickness (mm) | Intermediate Cu layer thickness (mm) | Total thickness of all Cu layers (mm) | Outermost Cu layer thickness/ thickness (—) |
| Example 10 | Five-layer clad material | Cu/Cu—Mo/Cu/Cu—Mo/Cu (0.5) (1.2) (1.4) (1.2) (0.5) | 25 | 0.10 | 0.29 | 0.50 | 0.10 |
| Example 11 | Seven-layer clad material | Cu/Cu—Mo/Cu/Cu—Mo/Cu/Cu—Mo/Cu (0.75) (0.67) (0.75) (0.67) (0.75) (0.67) (0.75) | 25 | 0.15 | 0.15 | 0.61 | 0.15 |
| Example 12 | Seven-layer clad material | Cu/Cu—Mo/Cu/Cu—Mo/Cu/Cu—Mo/Cu (0.6) (0.8) (0.6) (0.8) (0.6) (0.8) (0.6) | 25 | 0.13 | 0.13 | 0.51 | 0.13 |
| Example 13 | Five-layer clad material | Cu/Cu—Mo/Cu/Cu—Mo/Cu (0.07) (1.0) (2.9) (1.0) (0.07) | 25 | 0.02 | 0.56 | 0.60 | 0.02 |
| Example 14 | Five-layer clad material | Cu/Cu—Mo/Cu/Cu—Mo/Cu (0.07) (1.3) (2.3) (1.3) (0.07) | 25 | 0.02 | 0.45 | 0.49 | 0.02 |

TABLE 2-continued

| No. | Type | Clad structure *3 | Cu content of Cu—Mo (mass %) | Outermost Cu layer thickness (mm) | Intermediate Cu layer thickness (mm) | Total thickness of all Cu layers (mm) | Outermost Cu layer thickness/ thickness (—) |
|---|---|---|---|---|---|---|---|
| Example 15 | Five-layer clad material | Cu/Cu—Mo/Cu/Cu—Mo/Cu (0.07) (1.55) (1.8) (1.55) (0.07) | 25 | 0.02 | 0.36 | 0.40 | 0.02 |
| Comparative Example 3 | Cu—Mo composite material alone | — | 25 | — | — | — | — |
| Comparative Example 4 | Cu—Mo composite material alone | — | 25 | — | — | — | — |
| Example 16 | Five-layer clad material | Cu/Cu—Mo/Cu/Cu—Mo/Cu (0.1) (1.46) (2.0) (1.46) (0.1) | 44 | 0.02 | 0.48 | 0.52 | 0.02 |
| Example 17 | Five-layer clad material | Cu/Cu—Mo/Cu/Cu—Mo/Cu (0.1) (1.8) (1.2) (1.8) (0.1) | 44 | 0.02 | 0.24 | 0.28 | 0.02 |
| Example 18 | Five-layer clad material | Cu/Cu—Mo/Cu/Cu—Mo/Cu (0.1) (2.2) (0.5) (2.2) (0.1) | 44 | 0.02 | 0.09 | 0.13 | 0.02 |
| Comparative Example 5 | Cu—Mo composite material alone | — | 44 | — | — | — | — |

*1 Cu: Cu material, Cu—Mo: Cu—Mo composite material
*2 Outermost Cu layer thickness: thickness of Cu layer which is outermost layer Intermediate Cu layer thickness: thickness of Cu layer which is intermediate layer
*3 The numbers in brackets are thicknesses of respective materials before cladding (mm)

TABLE 3

| No. | Type | Clad stucture *3 | Cu content of Cu—Mo (mass %) | Outermost Cu layer thickness (mm) | Intermediate Cu layer thickness (mm) | Total thickness of all Cu layers (mm) | Outermost Cu layer thickness/ thickness (—) |
|---|---|---|---|---|---|---|---|
| Comparative Example 6 | Cu—Mo composite material alone | — | 44 | — | — | — | — |
| Comparative Example 7 | Cu—Mo composite material alone | — | 66 | — | — | — | — |
| Comparative Example 8 | Cu—Mo composite material alone | — | 59 | — | — | — | — |
| Comparative Example 9 | Cu—Mo composite material alone | — | 61 | — | — | — | — |
| Comparative Example 10 | Cu—Mo composite material alone | — | 60 | — | — | — | — |
| Comparative Example 11 | Three-layer clad material | Cu/Cu—Mo/Cu (0.8) (3.0) (0.8) | 40 | 0.17 | — | 0.34 | 0.17 |
| Comparative Example 12 | Cu—Mo composite material alone | — | 40 | — | — | — | — |
| Comparative Example 13 | Cu—Mo composite material alone | — | 61 | — | — | — | — |
| Comparative Example 14 | Cu—Mo composite material alone | — | 40 | — | — | — | — |
| Example 19 | Five-layer clad material | Cu/Cu—Mo/Cu/Cu—Mo/Cu (0.1) (0.9) (3.0) (0.9) (0.1) | 15 | 0.02 | 0.55 | 0.59 | 0.02 |
| Example 20 | Five-layer clad material | Cu/Cu—Mo/Cu/Cu—Mo/Cu (0.1) (1.1) (2.6) (1.1) (0.1) | 15 | 0.02 | 0.49 | 0.53 | 0.02 |
| Example 21 | Five-layer clad material | Cu/Cu—Mo/Cu/Cu—Mo/Cu (0.1) (1.35) (2.2) (1.35) (0.1) | 15 | 0.02 | 0.40 | 0.44 | 0.02 |

*1 Cu: Cu material, Cu—Mo: Cu—Mo composite material
*2 Outermost Cu layer thickness: thickness of Cu layer which is outermost layer Intermediate Cu layer thickness: thickness of Cu layer which is intermediate layer
*3 The numbers in brackets are thicknesses of respective materials before cladding (mm)

TABLE 4

| No. | Type | Total cold rolling reduction (%) *4 | Thickness (mm) | Mo content of whole heat sink (mass %) | Density (g/m³) | Thermal conductivity in thickness direction (W/m · K) | In-plane coefficient of thermal expansion (×10⁻⁶/K) 400° C. *5 | In-plane coefficient of thermal expansion (×10⁻⁶/K) 800° C. *6 |
|---|---|---|---|---|---|---|---|---|
| Comparative Example 1 | Three-layer clad material | 95 | 1 | 32 | 9.30 | 236 | 8.34 | 8.00 |
| Comparative Example 2 | Three-layer clad material | 95 | 1 | 37 | 9.37 | 216 | 8.03 | 7.64 |
| Example 1 | Five-layer clad material | 95 | 1 | 31 | 9.29 | 245 | 8.30 | 7.66 |
| Example 2 | Five-layer clad material | 95 | 1 | 39 | 9.38 | 224 | 7.90 | 7.25 |
| Example 3 | Five-layer clad material | 95 | 1 | 31 | 9.29 | 311 | 8.68 | 8.02 |
| Example 4 | Five-layer clad material | 95 | 1 | 40 | 9.40 | 281 | 8.22 | 7.63 |
| Example 5 | Five-layer clad material | 95 | 1 | 32 | 9.30 | 306 | 8.70 | 8.03 |
| Example 6 | Five-layer clad material | 95 | 1 | 40 | 9.40 | 272 | 8.39 | 7.76 |
| Example 7 | Five-layer clad material | 95 | 1 | 31 | 9.29 | 290 | 8.62 | 7.94 |
| Example 8 | Five-layer clad material | 95 | 1 | 39 | 9.39 | 259 | 8.06 | 7.44 |
| Example 9 | Five-layer clad material | 95 | 1 | 32 | 9.30 | 266 | 8.47 | 7.74 |

*4 Total rolling reduction combining rolling reduction of Cu—Mo composite material alone and rolling reduction of Cu—Mo composite material in clad material rolling
*5 Average coefficient of thermal expansion from 50° C. to 400° C.
*6 Average coefficient of thermal expansion from 50° C. to 800° C.

TABLE 5

| No. | Type | Total cold rolling reduction (%) *4 | Thickness (mm) | Mo content of whole heat sink (mass %) | Density (g/m³) | Thermal conductivity in thickness direction (W/m · K) | In-plane coefficient of thermal expansion (×10⁻⁶/K) 400° C. *5 | In-plane coefficient of thermal expansion (×10⁻⁶/K) 800° C. *6 |
|---|---|---|---|---|---|---|---|---|
| Example 10 | Five-layer clad material | 95 | 1 | 39 | 9.39 | 233 | 7.89 | 7.31 |
| Example 11 | Seven-layer clad material | 95 | 1 | 31 | 9.29 | 248 | 8.26 | 7.40 |
| Example 12 | Seven-layer clad material | 95 | 1 | 39 | 9.38 | 229 | 7.86 | 7.22 |
| Example 13 | Five-layer clad material | 70 | 1 | 32 | 9.30 | 319 | 9.95 | 8.93 |
| Example 14 | Five-layer clad material | 70 | 1 | 40 | 9.40 | 286 | 8.75 | 7.98 |
| Example 15 | Five-layer clad material | 70 | 1 | 47 | 9.48 | 258 | 8.49 | 7.83 |
| Comparative Example 3 | Cu—Mo composite material alone | 95 | 1 | 75 | 9.83 | 175 | 7.23 | 6.75 |
| Comparative Example 4 | Cu—Mo composite material alone | 98 | 1 | 75 | 9.83 | 168 | 7.40 | 6.89 |
| Example 16 | Five-layer clad material | 95 | 1 | 33 | 9.31 | 288 | 9.77 | 9.21 |
| Example 17 | Five-layer clad material | 95 | 1 | 41 | 9.41 | 254 | 9.39 | 8.74 |
| Example 18 | Five-layer clad material | 95 | 1 | 49 | 9.51 | 227 | 8.98 | 8.33 |
| Comparative Example 5 | Cu—Mo composite material alone | 90 | 1 | 56 | 9.60 | 221 | 9.30 | 8.70 |

*4 Total rolling reduction combining rolling reduction of Cu—Mo composite material alone and rolling reduction of Cu—Mo composite material in clad material rolling
*5 Average coefficient of thermal expansion from 50° C. to 400° C.
*6 Average coefficient of thermal expansion from 50° C. to 800° C.

TABLE 6

| No. | Type | Total cold rolling reduction (%) *4 | Thickness (mm) | Mo content of whole heat sink (mass %) | Density (g/m³) | Thermal conductivity in thickness direction (W/m · K) | In-plane coefficient of thermal expansion (×10⁻⁶/K) 400° C. *5 | In-plane coefficient of thermal expansion (×10⁻⁶/K) 800° C. *6 |
|---|---|---|---|---|---|---|---|---|
| Comparative Example 6 | Cu—Mo composite material alone | 93.5 | 1 | 56 | 9.60 | 214 | 9.10 | 8.40 |
| Comparative Example 7 | Cu—Mo composite material alone | 93.5 | 1 | 34 | 9.32 | 277 | 11.68 | 11.30 |
| Comparative Example 8 | Cu—Mo composite material alone | 93.5 | 1 | 41 | 9.41 | 249 | 10.48 | 9.40 |
| Comparative Example 9 | Cu—Mo composite material alone | 93.5 | 1 | 39 | 9.39 | 251 | 10.30 | 9.16 |
| Comparative Example 10 | Cu—Mo composite material alone | 93.5 | 1 | 40 | 9.40 | 251 | 10.46 | 9.33 |
| Comparative Example 11 | Three-layer clad material | 93.5 | 1 | 41 | 9.41 | 220 | 9.16 | 8.69 |
| Comparative Example 12 | Cu—Mo composite material alone | 93.5 | 1 | 60 | 9.65 | 206 | 8.76 | 8.06 |
| Comparative Example 13 | Cu—Mo composite material alone | 93.5 | 1 | 39 | 9.39 | 258 | 11.11 | 10.69 |
| Comparative Example 14 | Cu—Mo composite material alone | 90 | 1 | 60 | 9.65 | 206 | 8.82 | 8.17 |
| Example 19 | Five-layer clad material | 95 | 1 | 37 | 9.36 | 291 | 8.11 | 7.52 |
| Example 20 | Five-layer clad material | 95 | 1 | 43 | 9.43 | 267 | 7.50 | 7.20 |
| Example 21 | Five-layer clad material | 95 | 1 | 50 | 9.52 | 242 | 7.07 | 6.82 |

*4 Total rolling reduction combining rolling reduction of Cu—Mo composite material alone and rolling reduction of Cu—Mo composite material in clad material rolling
*5 Average coefficient of thermal expansion from 50° C. to 400° C.
*6 Average coefficient of thermal expansion from 50° C. to 800° C.

The invention claimed is:

1. A heat sink comprising three or more Cu layers and two or more Cu—Mo composite layers alternately stacked in a thickness direction so that two of the Cu layers are outermost layers on both sides,
   wherein each of the Cu—Mo composite layers has a thickness section microstructure in which flat Mo phase is dispersed in a Cu matrix,
   wherein a thickness $t_1$ of each of the Cu layers (1a) which are the outermost layers on both sides and a thickness $t_2$ of a Cu layer (1b) which is an intermediate layer satisfy $t_1 \le t_2$,
   wherein the thickness $t_1$ of each of the Cu layers (1a) which are the outermost layers on both sides and a thickness T of the heat sink satisfy $t_1/T \le 0.2$.

2. The heat sink according to claim 1, wherein the thickness $t_1$ of each of the Cu layers (1a) which are the outermost layers on both sides and the thickness $t_2$ of the Cu layer (1b) which is the intermediate layer satisfy $t_1 < t_2$.

3. The heat sink according to claim 2, wherein a total number of the Cu layers and the Cu—Mo composite layers is nine or more, and
   among a plurality of Cu layers (1b) which are intermediate layers, a thickness of an intermediate Cu layer that is closer to a thickness center of the heat sink is greater than a thickness of an intermediate Cu layer that is farther from the thickness center of the heat sink.

4. The heat sink according to claim 1, wherein each of the Cu—Mo composite layers has a structure in which a plurality of unit Cu—Mo composite layers are stacked with a bonding Cu layer of 75 μm or less in thickness being interposed therebetween.

5. The heat sink according to claim 1, wherein each of the Cu—Mo composite layers has a Cu content of 10 mass % to 50 mass %.

6. The heat sink according to claim 1, wherein a coating or plating is formed on one side or both sides of a heat sink body composed of the stacked Cu layers and Cu—Mo composite layers.

7. A semiconductor package comprising the heat sink according to claim 1.

8. A semiconductor module comprising the semiconductor package according to claim 7.

9. A method for manufacturing the heat sink according to claim 1, the method comprising:
   stacking a Cu—Mo composite material (a) having a thickness section microstructure in which Mo phase is dispersed in a Cu matrix and a Cu material (b);
   diffusion bonding the stacked Cu—Mo composite material (a) and Cu material (b) to obtain a laminate; and
   thereafter subjecting the laminate to cold rolling (x), to obtain a heat sink in which Cu—Mo composite layers formed by the Cu—Mo composite material (a) and Cu layers formed by the Cu material (b) are stacked.

10. The method according to claim 9, wherein the Cu—Mo composite material (a) is obtainable by pressing a mixed powder of a Mo powder and a Cu powder to obtain a green compact, and sintering the green compact in a reducing atmosphere or in a vacuum to obtain a sintered body.

11. The method according to claim 9, wherein the Cu—Mo composite material (a) is obtainable by pressing a mixed powder of a Mo powder and a Cu powder to obtain a green compact, sintering the green compact in a reducing atmosphere or in a vacuum to obtain a sintered body, and densifying the sintered body.

12. The method according to claim 9, wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, and impregnating the sintered body with Cu molten in a non-oxidizing atmosphere or in a vacuum.

13. The method according to claim 9, wherein a rolling reduction in the cold rolling (x) is 70% to 99%.

14. The method according to claim 9, wherein the Cu—Mo composite material (a) is obtainable by pressing a mixed powder of a Mo powder and a Cu powder to obtain a green compact, sintering the green compact in a reducing atmosphere or in a vacuum to obtain a sintered body, densifying the sintered body, and subjecting a resultant densified Cu—Mo composite material to rolling (y).

15. The method according to claim 14, wherein a total rolling reduction of the Cu—Mo composite material (a) combining the cold rolling (x) and the rolling (y) is 70% to 99%.

16. The method according to claim 9, wherein the Cu—Mo composite material (a) is obtainable by pressing a Mo powder or a mixed powder of a Mo powder and a Cu powder to obtain a green compact, sintering the green compact in a reducing atmosphere or in a vacuum to obtain a sintered body, impregnating the sintered body with Cu molten in a non-oxidizing atmosphere or in a vacuum, and subjecting a resultant Cu—Mo composite material impregnated with Cu to rolling (y).

17. The method according to claim 16, wherein a total rolling reduction of the Cu—Mo composite material (a) combining the cold rolling (x) and the rolling (y) is 70% to 99%.

18. A method for manufacturing the heat sink according to claim 1, the method comprising:
 stacking a Cu—Mo composite material (a) having a thickness section microstructure in which Mo phase is dispersed in a Cu matrix and a Cu material (b);
 diffusion bonding the stacked Cu—Mo composite material (a) and Cu material (b) to obtain a laminate; and
 thereafter subjecting the laminate to rolling (x'), to obtain a heat sink in which Cu—Mo composite layers formed by the Cu—Mo composite material (a) and Cu layers formed by the Cu material (b) are stacked,
wherein
 the Cu—Mo composite material (a) is produced by a method involving rolling (y),
 the Cu—Mo composite material (a) has a Cu content of less than 20 mass %,
 a total rolling reduction of the Cu—Mo composite material (a) combining the rolling (x') and the rolling (y) is 70% or more, and
 the method comprises at least one of:
 (1) performing the rolling (x') by warm rolling; and
 (2) performing the rolling (y) by warm rolling.

19. A method for manufacturing the heat sink according to claim 1, the method comprising:
 stacking a Cu—Mo composite material (a) having a thickness section microstructure in which Mo phase is dispersed in a Cu matrix and a Cu material (b);
 diffusion bonding the stacked Cu—Mo composite material (a) and Cu material (b) to obtain a laminate; and
 thereafter subjecting the laminate to rolling (x'), to obtain a heat sink in which Cu—Mo composite layers formed by the Cu—Mo composite material (a) and Cu layers formed by the Cu material (b) are stacked,
wherein
 the Cu—Mo composite material (a) is produced by a method involving rolling (y),
 the Cu—Mo composite material (a) has a Cu content of 20 mass % to 30 mass %,
 a total rolling reduction of the Cu—Mo composite material (a) combining the rolling (x') and the rolling (y) is 96% or more, and
 the method comprises at least one of:
 (1) performing the rolling (x') by warm rolling; and
 (2) performing the rolling (y) by warm rolling.

* * * * *